United States Patent [19]

Costas

[11] Patent Number: 4,811,259
[45] Date of Patent: Mar. 7, 1989

[54] LIMITED SHIFT SIGNAL PROCESSING SYSTEM AND METHOD

[75] Inventor: John P. Costas, Waban, Mass.

[73] Assignee: Cogent Systems, Inc., Waban, Mass.

[21] Appl. No.: 826,804

[22] Filed: Feb. 6, 1986

Related U.S. Application Data

[63] Continuation-in-part of Ser. No. 781,241, Sep. 27, 1985.

[51] Int. Cl.[4] ............................................. G06F 7/38
[52] U.S. Cl. .................................. 364/724.16; 364/581
[58] Field of Search ............... 364/724, 581, 824, 825, 364/862

[56] References Cited

U.S. PATENT DOCUMENTS

| | | | |
|---|---|---|---|
| 3,696,235 | 10/1972 | Tufts et al. ............................ | 364/724 |
| 3,979,701 | 9/1976 | Tomozawa ............................ | 364/825 |
| 4,034,199 | 7/1977 | Lampe et al. ........................ | 364/825 |
| 4,104,729 | 8/1978 | Gingell ................................. | 364/724 |
| 4,135,248 | 1/1979 | Bluzer .................................. | 364/554 |
| 4,349,915 | 9/1982 | Costas .................................. | 367/134 |
| 4,430,721 | 2/1984 | Acampura ............................ | 364/724 |
| 4,470,126 | 9/1984 | Haque .................................. | 364/824 |
| 4,475,170 | 10/1984 | Haque .................................. | 364/825 |
| 4,543,640 | 9/1985 | Coutures ............................. | 364/824 |
| 4,571,732 | 2/1986 | Arani et al. .......................... | 364/724 |
| 4,605,913 | 8/1986 | Pfleiderer et al. .................. | 364/824 |
| 4,644,488 | 2/1987 | Nathan ................................. | 364/724 |
| 4,691,293 | 9/1987 | Conboy ............................... | 364/724 |

Primary Examiner—Parshotam S. Lall
Assistant Examiner—S. A. Melnick
Attorney, Agent, or Firm—Joseph S. Iandiorio; Douglas E. Denninger

[57] ABSTRACT

A high-speed, limited-shift signal processor for quantized weighting of an input signal, which receives the input signal and delays is to provide a plurality of delay outputs and selects a number of the delay outputs to be modified by limited shifting of their place values. The limited-shift signal processor generates at least one weighted value from each delay output, including shifting the digit positions of each selected delay output to shift its place value, and sums each of the place-value-shifted delay outputs to obtain a weighted sum signal of the input signal.

30 Claims, 15 Drawing Sheets

LIMITED SHIFT SIGNAL PROCESSING SYSTEM AND METHOD

RELATED APPLICATION

This application is a continuation-in-part of U.S. patent application, Ser. No. 781,241, filed Sept. 27, 1985, entitled "Apparatus and Method for Quantizing a Set of Weights for a Weighted Sum Signal Processor System", by John P. Costas.

FIELD OF INVENTION

This invention relates to a high-speed, limited-shift signal processing system and method for quantized weighting of an input signal, and more particularly to such a system and method which derive, from each of a number of delayed values of the input signal, at least one weighted value. The derivation includes shifting the digit positions of preselected delayed values to modify them by limited, predetermined shifting of their place values. The system and method recombine all place-shifted delayed values to obtain a weighted sum signal of the input signal.

BACKGROUND OF INVENTION

There are a number of applications in which a set of values is transformed into a set of weighted sums where each weighted sum is produced by individually multiplying a plurality of the values with a set of weights and summing the individual product values. One such application is in the field of signal processing. Presently, multipliers are used to multiply successive signal values by the set of weights. Multipliers, while operating at ever higher speeds, typically remain the slowest link in the signal processing chain. Binary multiplication is accomplished swiftly in digital processing but not swiftly enough in many environments where data input and sampling rates are extremely high. Further, digital multipliers are power consumptive.

Attempts to diminish the obstacle of multiplier speed are approached from at least three directions. One is the ongoing attempt to build ever faster multipliers. Another is to use fewer multipliers by reducing the number of terms in the weighted sum and thus the number of multipliers required to obtain the weighted sum. Reducing the number of weights, however, significantly decreases the accuracy of the signal processing.

Another attempt limits the number of nonzero digits of each weight value such as by quantizing each weight value to be multiplied: in quantizing, the value is converted into one of a set of discrete values having few nonzero digits. As presently implemented, however, accuracy is greatly diminished by this approach.

A typical area where the problem of multiplier speed arises is in filtering using coefficient multiplication of delayed signal samples. A signal processor takes signals over a time window, that is, a time period, and multiplies these values by weights from a weight function such as might be obtained from a handbook. Reduction in the number of non-zero digits of the multiplier coefficients by conventionally quantizing them loses part of the information required to maintain acceptable filter performance.

Additional problems are presented by the output of the multipliers. Products simultaneously generated by the multipliers must be combined as rapidly as possible by a summer to produce each weighted sum. In high-speed applications the limits of conventional summers are often reached and pose barriers to the construction of ever faster digital filters.

SUMMARY OF INVENTION

It is therefore an object of this invention to provide an improved system and method of modifying input signals by preselected weights for which the number of nonzero digits in their numerical representations is controlled.

It is a further object of this invention to provide such a system and method which utilize a relatively small number of simple shift and add operations instead of lengthy multiplications.

It is a further object of this invention to provide such a system and method which are significantly faster than conventional signal processors.

A still further object of this invention is to provide such a system and method which more rapidly combine weighted values to produce each weighted sum.

Yet another object of this invention is to provide such a system and method that utilize converted, quantized weight sets which maintain accuracy in signal processing.

The invention results from the realization that a truly improved higher-speed and simpler quantized weighting system for processing an input signal can be achieved by a signal processor which creates one or more weighted values from the output of each tap of a delay line containing the input signal, including creating weighted values by shifting the digit positions of preselected outputs by limited, predetermined place-value-shifts, and recombines all of the place-value-shifted delay outputs to obtain a weighted sum signal of the input signal.

This invention features a high-speed, limited-shift signal processor for quantized weighting of an input signal, including delay means for receiving the input signal and providing a plurality of delay outputs and means for generating at least one weighted value from each delay output. The means for generating includes a plurality of means for shifting the digit positions of preselected delay outputs to modify each preselected delay output by limited predetermined shifting of its place value. There is also means for steering the preselected delay outputs to one or more of the means for shifting and means for summing each of the order-shifted delay outputs generated by the means for shifting to obtain a weighted sum signal of the input signal.

In one embodiment, each of the means for shifting accomplishes a single predetermined place value shift selected from zero to a limited maximum number of shifts. There may be only one means for shifting to accomplish each predetermined place value shift. The means for generating may further include a plurality of summing means, responsive to the means for steering, for combining delay outputs preselected to undergo the same place value shift; each of the means for shifting may be responsive to one of the summing means.

In another embodiment, the limited-shift signal processor further includes means for selectively negating the preselected delay outputs. The means for steering includes means for reconfiguring the steering of delay outputs, such as switching means for modifying the distribution of the preselected delay outputs to the means for shifting. Each delay output is associated with at least one preselected quantized weight having a shift value that is represented by a term having a limited number of nonzero digits. Each weighted value is a function of its respective delay output and one of the quantized weights. The weighted sum signal is then a function of the preselected quantized weights and of the input signal. The means for steering includes means for selectively negating the preselected delay outputs according to the polarity of the quantized weights.

The means for generating may further include means for setting predesignated delay outputs to zero, and the means for steering directs each delay output to at least one of (a) the means for setting to zero and (b) one of the means for shifting; or (a) the means for setting to zero, (b) the means for setting to zero and at least one of the means for shifting, (c) at least two different means for shifting, and (d) at least twice to the same means for shifting. Each delay output may be associated with at least two preselected quantized weights, each representing a zero value or a limited place-value-shift value.

In one embodiment the quantized weights having a shift value and the quantized weights representing a value of zero are distributed together in at least two sets, the sets are adjusted to have the same number of quantized weights, and the delay means provides the same number of delay outputs as the number of quantized weights in each adjusted preselected set. Each shift value may be represented by a single non-zero digit in a numerical system.

This invention in addition features a limited-shift signal processor constructed from a plurality of signal processing units, each unit including delay means, means for generating, means for steering, and means for summing place-value-shifted delay outputs to obtain a weighted sum signal. The signal processor further includes final summer means for combining all of the weighted sum signals to provide a final weighted sum signal of the input signal.

This invention also features a method of weighting an input signal, including receiving an input signal and delaying it to provide a plurality of delay outputs and selecting at least some of the delay outputs to be modified by limited shifting of their place values. The method further includes generating at least one weighted value from each delay output including shifting the place value of each selected delay output by one of a number of predetermined digit positions, and summing each of the place-value-shifted delay outputs to obtain a weighted sum signal of the input signal.

The method may further include adding together, before shifting, the selected delay outputs to be shifted by the same order shift. The method may also include selectively negating the delay outputs and setting to zero the unselected delay outputs.

This invention may also be expressed as a method of weighting an input signal by a first group of quantized weights derived from a plurality of original weights representing a preselected weighting specification, including converting the plurality of original weights into the first group of quantized weights such that each quantized weight is represented by a term having a limited number of nonzero digits, receiving the input signal and delaying it to provide a plurality of delay outputs, and matching, to one of the delay outputs, each quantized weight representing a nonzero weighting value. The method further includes shifting the place value of each matched delay output to modify it by the limited number of nonzero digits of that quantized weight and summing each of the place-value-shifted delay outputs to obtain a first weighted sum signal of the input signal. Each quantized weight representing a nonzero weighting value may be represented by a term having a single nonzero digit and the unmatched delay outputs may be set to zero.

The method may further include retaining residual error values generated during the conversion of the plurality of original weights into the first group of quantized weights, converting the residual error values into a second group of quantized weights such that each quantized weight is represented by a term having a limited number of nonzero digits, and providing a final weighted sum signal which is a function of the first and second group of quantized weights and the input signal. The step of providing may include receiving the input signal and delaying it to provide a plurality of second delay outputs and matching, to one of the second delay outputs, each quantized weight of the second group representing a nonzero weighting value. The place value of each matched second delay output is shifted to modify it by the limited number of nonzero digits of that quantized weight of the second group. Each of the place-value-shifted delay outputs is summed to obtain a second weighted sum signal of the input signal, and the first and second weighted sum signals are combined to provide a final weighted sum signal of the input signal.

DISCLOSURE OF PREFERRED EMBODIMENT

Other objects, features and advantages will occur from the following description of a preferred embodiment and the accompanying drawings, in which.

This invention may be accomplished by a limited-shift signal processor which includes a storage unit such as a delay line for successively advancing sampled signal values of an input signal past a number of output taps to obtain a number of delay outputs, a weighting circuit including a plurality of shift devices which accomplish limited, predetermined shifting of the place values of the delay outputs, lines for steering preselected delay outputs to one or more of the shift devices, and a final adder for summing the place-value-shifted delay outputs while retaining their shifted place values. Unlike conventional signal processors, two or more weighted values are typically generated in the weighting circuit which accomplishes a weighting specification for each delay output; similar to conventional signal processors, a single weighted sum is provided as the final output.

The delayed outputs from the delay line are conveyed according to preselected criteria such as the sequence and shift values of preselected quantized weights; the quantized weights can be obtained by converting an initial set of weights as described infra.

Additional operations may be performed on the delay outputs to obtain two or more weighted values for each delay output. In one construction, the weighting circuit includes a zero value circuit for setting predesignated delay outputs to zero and the steering circuit directs predesignated delay outputs to the zero value circuit. An output is set to zero when the preselected criteria indicate that that particular delay output does not contribute to the weighted sum final output. In this construction two or more weighted values for each delay output are obtained by steering the delay output to (a) the zero value circuit, (b) to the zero value circuit and one or more shift devices, (c) to at least two different shift devices or (d) at least twice to the same shift device. Steering a delay output only to the zero value circuit is equivalent to steering it to at least two such circuits; at least two weighted values are considered to be generated in this manner.

Figures 1, 2:
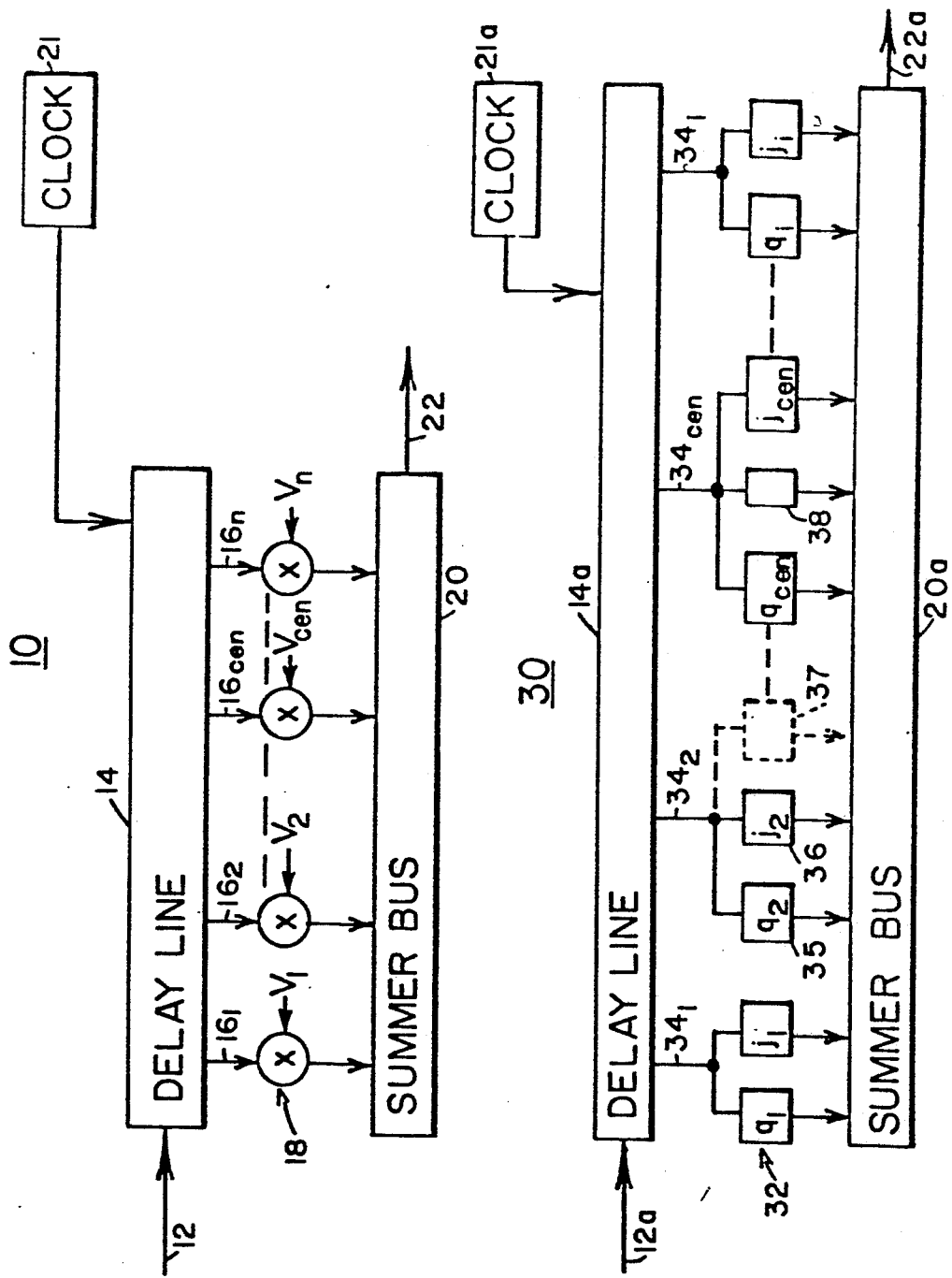
FIG. 1 is a schematic of a conventional signal processor having a plurality of weights implemented with multipliers.
FIG. 2 is a schematic of a signal processor according to this invention using only shift devices to implement several sets of converted, quantized weights.
Figure 11:
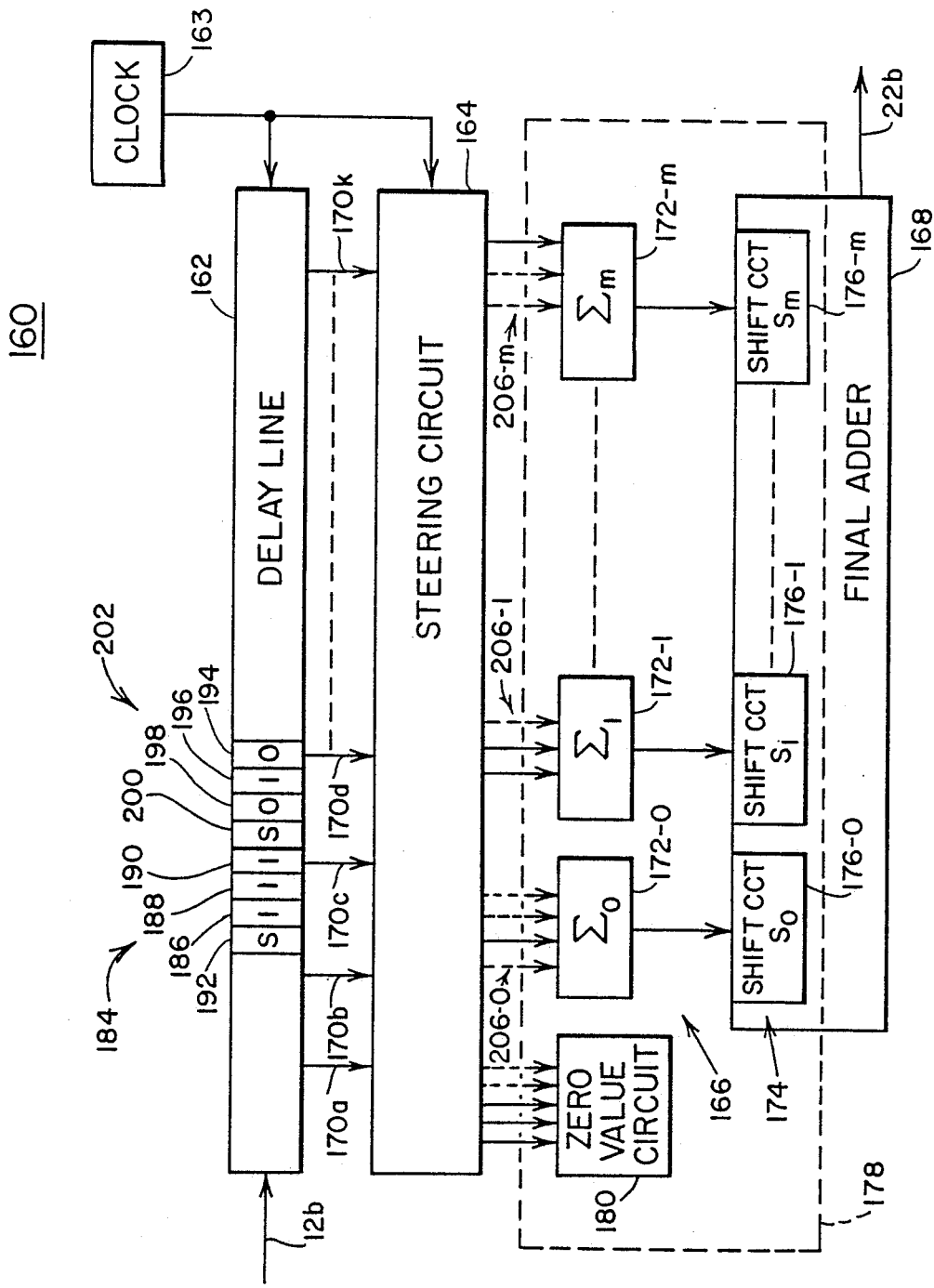
FIG. 11 is a schematic of another signal processor according to this invention which concentrates the shifting to a small number of shift devices.

The limited-shift processor according to this invention may include one shift device per quantized weight, such as discussed infra in relation to FIG. 2, or may include a lesser number of shift devices, such as discussed infra in relation to FIG. 11. The latter construction includes a number of shift concentrator summers each of which receive and combine one or more signal values having the same shift specification and provide a single serial output of these shift-associated values to one of the shift devices. It is desirable to arrange the shift concentrator summers and shift devices successively to provide shifts of successive place value. Their outputs are appropriately combined in the final summer according to their place values to generate successive weighted sums as a function of the input signal and the preselected quantized weights.

The sampled signal values may be steered along fixed, predetermined paths. Alternatively, the paths may include switche or other devices for reconfiguring the paths to provide for an adaptive signal processor capability.

The converted weights used by the present invention may be obtained using an apparatus and method which cyclically process an initial set of weights, such as a set of weights to be utilized in a conventional digital filter, to produce one or more converted weight sets which can be utilized in an improved, more rapid digital filter according to this invention. Each value in the converted sets of weights is a discrete value, preferably a value represented by a single nonzero digit in a numerical system; the number of place shifts required to implement this value ranges from zero to a predetermined limiting number. The apparatus and method repeatedly quantize a set of initial weight values to produce a series of quantized sets and error sets, store each quantized set of weights in a storage array, transform each error set into a transformed set, and add each transformed set to a succeeding storage array.

After a predetermined number of storage arrays have received a transformed set and subsequently had that transformed set quantized, the next transformed set is added to a storage array already occupied by a quantized set. Each quantized set is requantized after a transformed set is added to it to produce a resulting quantized set and a resulting error set. The process is continued until the error sets are sufficiently diminished in size; at this point, the several quantized sets represent the converted sets of weights which replace the initial set of weights.

Unlike the initial set of weights, the converted sets of weights require only simple shift devices for implementation when each discrete value is represented by a single nonzero digit. Each signal value can be shifted from zero place values up to a predetermined limiting number of place values as determined by the shift value of the quantized weights; in many applications some shift values between zero place values and the limiting number are not involved.

An improved signal processor according to this invention utilizes a plurality of converted sets of weights to rapidly process signal values. Each converted weight value in each converted weight set is a discrete term, preferably having a single nonzero digit; typically, the initial weight values are continuous terms, each having a large uncontrolled number of nonzero digits. Each converted weight value also contains a sign command which indicates whether a signal value being shifted should also be negated.

The difference in implementation of converted weights is seen when FIGS. 1 and 2 are compared. Conventional signal processor 10, FIG. 1, receives time-sampled and digitized signal input 12 to delay line 14. As the signal values are stepped through delay line 14, the signal values are accessed through signal taps $16_1$, $16_2$ through $16_n$ where they are multiplied by weight values $V_1$, $V_2$, ... $V_n$ utilizing multipliers 18 and combined in summer bus 20; after each clock period, provided by clock 21, a weighted sum signal value is produced as part of signal output 22.

Each multiplier 18 is associated with a preselected weight value chosen such that the set of all weights $V_1$ through $V_n$ provides a desired weighted sum of the signal values. Weight value $V_{cen}$ implemented by multiplier at tap $16_{cen}$ represents the center of the initial weight set when there is an odd number of values in that set.

The speed and efficiency of conventional signal processor 10 are limited by multipliers 18. Each multiplier conducts a number of shift-and-add operations. Multipliers 18 are time-consuming and require a relatively large amount of power to multiply the signal values by the set of weights $V_1$ to $V_n$.

In contrast, improved limited-shift signal processor 30, FIG. 2, uses simple shift devices 32 at taps $34_1$, $34_2$ through $34_i$ from delay line 14a, Each tap provides a digitized signal value from signal input 12a which is steered by fixed lines as shown to at least two shift devices, one for each converted weight set $Q_1$ through $Q_X$. Improved signal processor 30 utilizes two sets of converted weights, converted weight set $Q_1$ containing converted weight values $q_1$ through $q_i$ and converted weight set $Q_2$ containing converted weight values $j_1$ through $j_i$. For example, tap $34_2$ provides a signal value to shift devices 35, 36 containing converted weight values $q_2$ and $j_2$, respectively. Improved signal processor 30 is adapted for three converted weight sets by adding an additional shift device to each tap such as shift device 37, shown in phantom, for tap $34_2$.

Preferably, the converted weight value contained in each shift device 32 is a discrete term having a sign command and a single nonzero digit as a shift command. Shift device 32 implements the shift command by shifting the place value of the signal element by a shift value ranging from zero to a predetermined maximum number; the implementation is equivalent to multiplying the signal value by a factor having a single nonzero digit in the numerical system of the signal value. When the sign of the shifted signal value need not be changed, the sign command is simply the absence of a sign change command. Each discrete term has a single nonzero digit such that there are X number of nonzero digits combined with, that is, operative upon, each signal value for X number of converted weight sets.

The output of the shift device is a combined value—a signal value shifted a specified number of places to the right and possibly having its sign changed—which is then summed with all other shift values also combined during each clock period, provided by clock 21a, as weighted sum signal value output 22a. By comparison, conventional signal processor 10, FIG. 1, must multiply—sequentially shift-and-add signal values in each multiplier—and then conduct yet another summing operation to sum all the multiplied signal values to provide weighted sum signal value output 22. As described infra, the frequency-domain behavior of the weighting afforded by a conventional signal processor and a limited-shift signal processor according to this invention are similar over a specified spectral region.

If the original weight set $V_1$ to $V_n$ has an even symmetry about $V_{cen}$, then the converted weight sets $Q_1$ and $Q_2$ will also have an even symmetry about $q_{cen}$ and $j_{cen}$, respectively. The converted weight sets typically have a greater number of values than the original weight set such that $$i > n. \qquad (1)$$

Further, when $V_{cen}$ has a value of one, $V_{cen}$ is changed to zero for improved quantizing. Shift device 38, FIG. 2, restores the altered central value by restoring a weight of one—a zero shift—for each signal value accessed by tap $34_{cen}$.

In general, one can normalize the original weight set values $V_1$ to $V_n$ so that the maximum value of the normalized weight set becomes unity. This value is then set to zero and quantized sets $Q_1$ to $Q_X$ are generated. The omitted unity term is then accounted for by inserting a zero shift weight at the appropriate tap position such as described above for a central peak value restored by shift 38.

Figure 3:
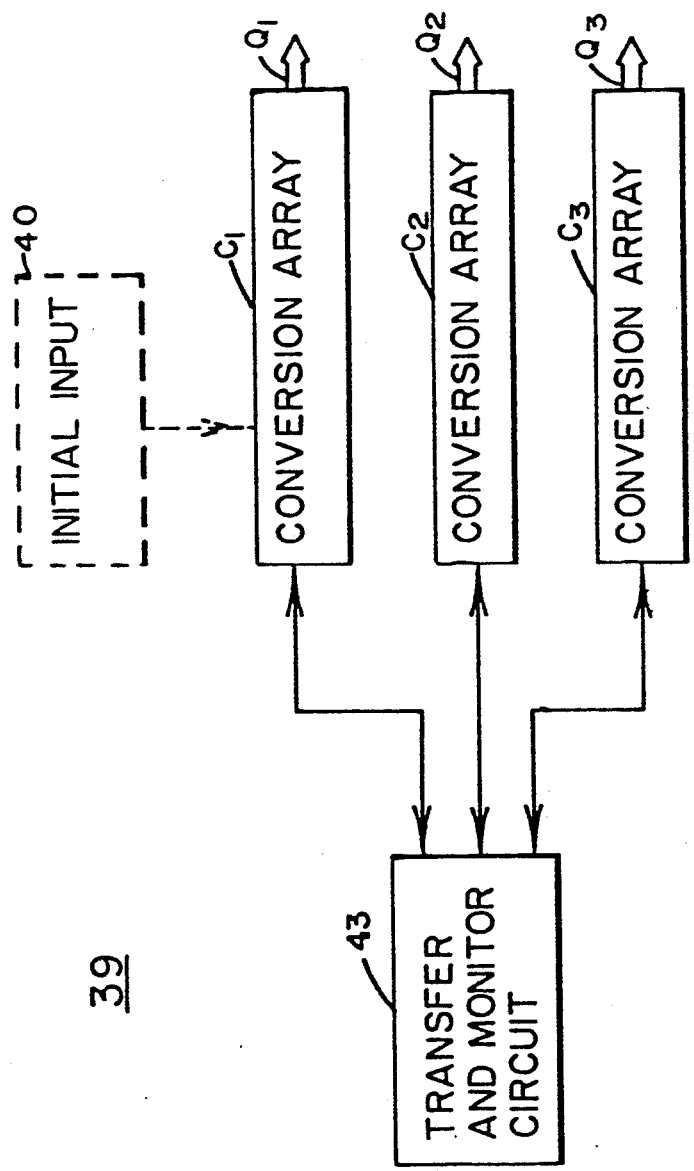
FIG. 3 is a schematic block diagram of an apparatus for converting a set of initial weights.

Apparatuses for converting the initial weight set into converted weight sets utilized in signal processors according to this invention are shown in FIGS. 3-10. Another construction of a limited-shift signal processor according to this invention is shown in FIGS. 11-15. Conversion apparatus 39, FIG. 3, provides converted weight sets $Q_1$, $Q_2$, $Q_3$ from conversion arrays $C_1$, $C_2$ and $C_3$, respectively. Arrays $C_1$, $C_2$ and $C_3$ are initialized to zero. The original set of weight values $V_1$ through $V_n$—continuous weight values to be converted—are then provided as initial input 40 to conversion array $C_1$. The set of values to be converted is quantized in array $C_1$ to produce a set of discrete values and a set of error values representing the residual of the quantization. The discrete value set replaces the current contents of array $C_1$, i.e., the set of values to be converted. The error value set is transformed into a transformed set and passes to transfer and monitor circuit 43 which places the transformed set into a successive conversion array by additive combination with the current contents of that array. The contents of the newly-incremented array, e.g., array $C_2$, are quantized to produce a discrete value set and a set of error values. The discrete value set—a quantized set—replaces the contents of array $C_2$. The error set is transformed and transfer and monitor circuit 43 adds the transformed set most recently formed with the quantized set of the next conversion array. For example, if conversion arrays $C_1$, $C_2$ and $C_3$ are successively operated in that order, transfer and monitor circuit 43 adds the transformed error set formed from the quantization operation in array $C_3$ with the quantized set extant in conversion array $C_1$. The operations are continued until a predetermined condition is satisfied.

Transfer and monitor circuit 43 determines when the predetermined condition is satisfied. One condition for termination can be a predetermined maximum magnitude to which the peak error value must diminish. Another condition is a maximum number of error values allowable within each conversion array, or a maximum number of cycles among the arrays.

During normal operation, the most recently formed transformed error set from one conversion array is additively combined with the quantized set in another conversion array; the combination is later quantized. When the predetermined condition is satisfied, conversion apparatus 39 ceases operation rather than transform the resulting error set and increment the contents of the next conversion array. The quantized sets in the conversion arrays represent the converted weight sets: conversion arrays $C_1$, $C_2$ and $C_3$ provide converted weight sets $Q_1$, $Q_2$ and $Q_3$, respectively.

It is also possible to use a single conversion array. In this special case the transformed error set from the single array $C_1$ is directed by transfer and monitor circuit 43 back to array $C_1$ where it is added to the set of discrete values most recently formed. There will only be a single converted weight set $Q_1$ resulting in this case.

Figure 4:
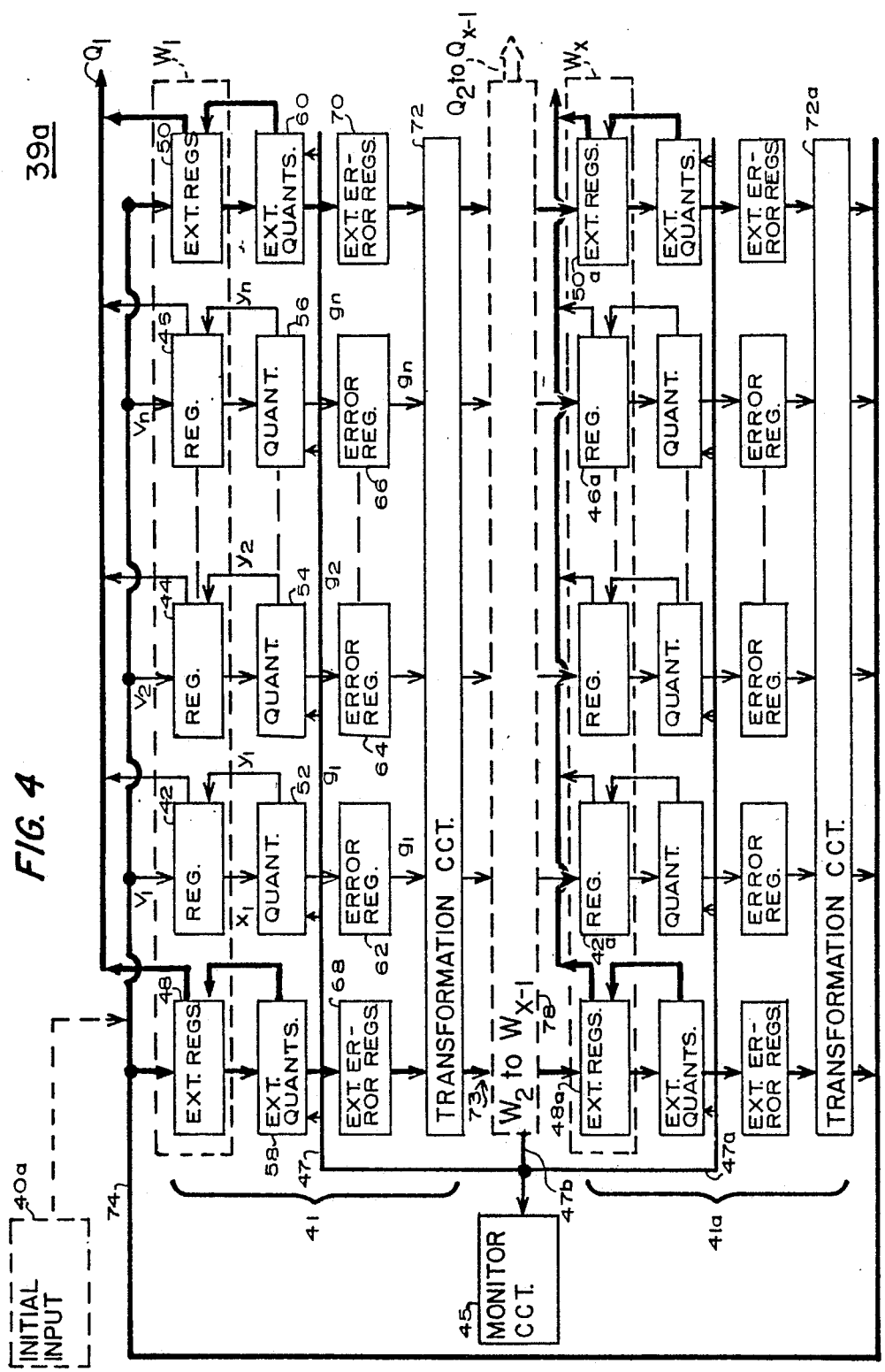
FIG. 4 is a more detailed block diagram of an alternative apparatus for converting the set of initial weights.

Conversion apparatus 39a, FIG. 4, provides converted weight sets $Q_1$ through $Q_X$ where X is preferably equal to or greater than two; at least two conversion arrays 41, 41a are normally used. The set of initial weight values $V_1$ through $V_n$ to be converted are provided as initial input 40a to registers 42 and 44 through 46 of storage array $W_1$ which is part of conversion array 41. Initially, no values are placed in extension registers 48 or in extension registers 50. Weight values $V_1$ through $V_n$ are then provided by registers 42 and 44 through 46 to quantizers 52 and 54 through 56, respectively, where each value is quantized into a discrete value of a set of discrete values. The quantization produces an error value representing the difference between the nonquantized value and the discrete value. Each quantized value is returned—to the register which supplied the value to be quantized—to replace the nonquantized value previously in that register; for example, the discrete quantized value from quantizer 52 replaces continuous weight value $x_1$, which initially is $V_1$, in register 42. Extension quantizers 58 and 60 are not accessed at this time since registers 48 and 50 have not yet been activated. The error values are provided to line 47 of monitor circuit 45 which compares the magnitude of the peak error value to a predetermined magnitude. Monitor circuit 45 also halts operation of apparatus 39a when growth of the number of error values exhausts the capacity of the extension registers.

The difference between nonquantized value $x_1$ previously in register 42 and quantized value $y_1$ is error value $g_1$ which, after being provided to line 47, passes to error register 62. Similarly, quantized value $y_2$ is placed into register 44 while error value $g_2$ is placed in error register 64 and, in quantizer 56, quantized value $y_n$ is placed in register 46 while error value $g_n$ is placed in error register 66. Extension error registers 68 and 70 are not yet activated. Error values $g_1$ through $g_n$ are provided to transformation circuit 72 where the error values are transformed as described below.

The operation within conversion array 41 is repeated in successive conversion arrays as each transformed error set is placed into register arrays $W_2$ through $W_{X-1}$ as indicated in phantom. A transformed set of error values from transformation circuit 72 or, when more than two conversion arrays are used, a transformed set from an intermediate array, is placed into conversion array 41a by transfer bus 73. Alignment is maintained such that a transformed error value derived from initial value $V_1$ is placed into register 42a while the transformed value derived from error value $g_n$, which was in turn derived from the original weight value $V_n$, is placed into register 46a. Where X=2, the transformed set of error values derived from transformation circuit 72 is placed directly into storage array $W_X$ of conversion array 41a.

Extension registers 48a and 50a are utilized as well. As described below, the action of transforming produces a transformed error set having a greater number of values than the input error set.

Quantizing the contents of each active register in storage array $W_X$ is such that each value of the quantized set is replaced into its respective register while the resulting error value is placed into its respective error register and then transformed in transformation circuit 72a to form a resulting transformed set.

The set of transformed error values obtained from transformation circuit 72a is then added to the contents of storage array $W_1$ as indicated by transfer bus 74. This procedure is repeated in cyclic fashion until the values of the error sets diminish in magnitude, preferably until the values diminish substantially. Monitor circuit 45 monitors the magnitudes of the resulting error value sets as sampled by lines 47, 47b, and 47a, and compares the magnitudes to a predetermined magnitude. When the magnitudes diminish to that predetermined magnitude, monitor circuit 45 ceases operation after the just-completed quantization as described below.

Although the conversion operation of successively quantizing and transforming is described for conversion apparatus 39a as sequential, the storage array into which the most recently transformed set is placed need not be the next sequential storage array. For example, if X=3 such that three storage arrays $W_1$, $W_2$, and $W_3$ are utilized by conversion apparatus 39, the third transformed set—produced by transforming the error set obtained when the contents of storage array $W_3$ are quantized—can be added to the contents of storage array $W_2$ instead of storage array $W_1$. That is, the processing order can be $W_1$, $W_2$, $W_3$, $W_2$, $W_3$, $W_2$, $W_3$ . . . or any other random sequence of $W_X$ arrays.

After a transformed set is provided by one of the conversion arrays of conversion apparatus 39a, the storage array receiving the transformed set contains a mixed set of quantized values incremented by transformed error values while the other storage arrays contain only quantized values. When the resulting error values are sufficiently small in magnitude or when other predetermined conditions are satisfied, as detected by monitor circuit 45, conversion apparatus 39a ceases operation after the just-completed quantization in the array containing the mixed set of values, thus providing converted weight sets $Q_1$-$Q_X$. For example, where X=2 such that conversion arrays 41 and 41a are the sole arrays utilized in the instant procedure and the predetermined condition is satisfied, as detected on line 47a, the process within conversion array 41a is suspended after quantization; the just-derived error set is not transformed and the alternate storage array $W_1$ is not incremented. Converted weight value sets $Q_1$ and $Q_2$ are read out on lines 76, 78, respectively.

Figure 5A:
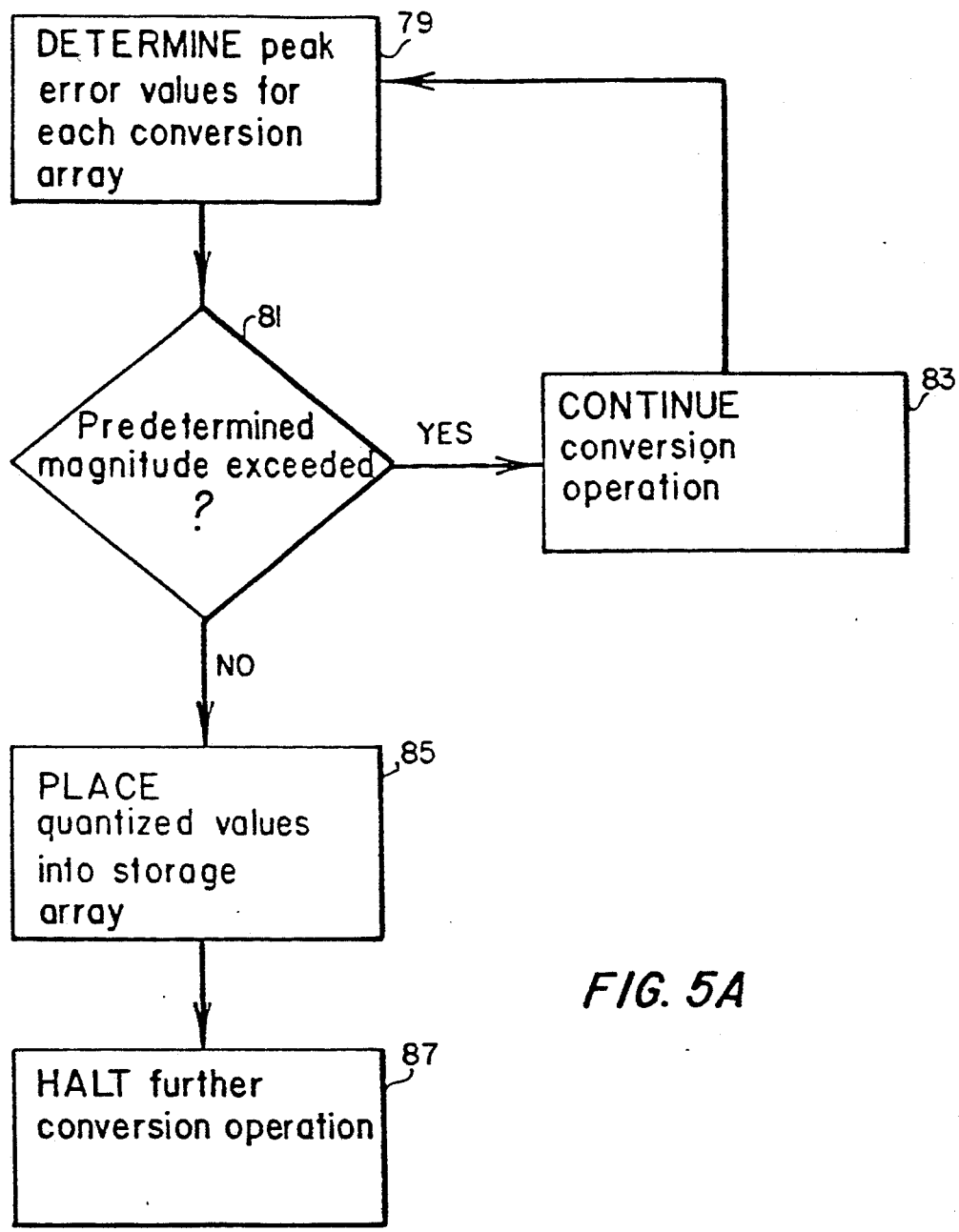
FIG. 5A is a flow chart of logic performed in the monitor circuit of FIG. 4.

The logic performed by monitor circuit 45, FIG. 4, is shown in FIG. 5A. Each value set passes to the monitor circuit where the values are examined, step 79. The peak error value is compared to the predetermined error magnitude value, step 81, before the most recently formed error value set is transformed into a transformed set. If the predetermined value is exceeded conversion operation continues, step 83. When the predetermined value is not exceeded, the monitor circuit commands the quantizers to place the quantized values back into the storage array, step 85 and halts further conversion operation, step 87. At that point the quantized sets represent the converted weight sets.

Figure 5B:
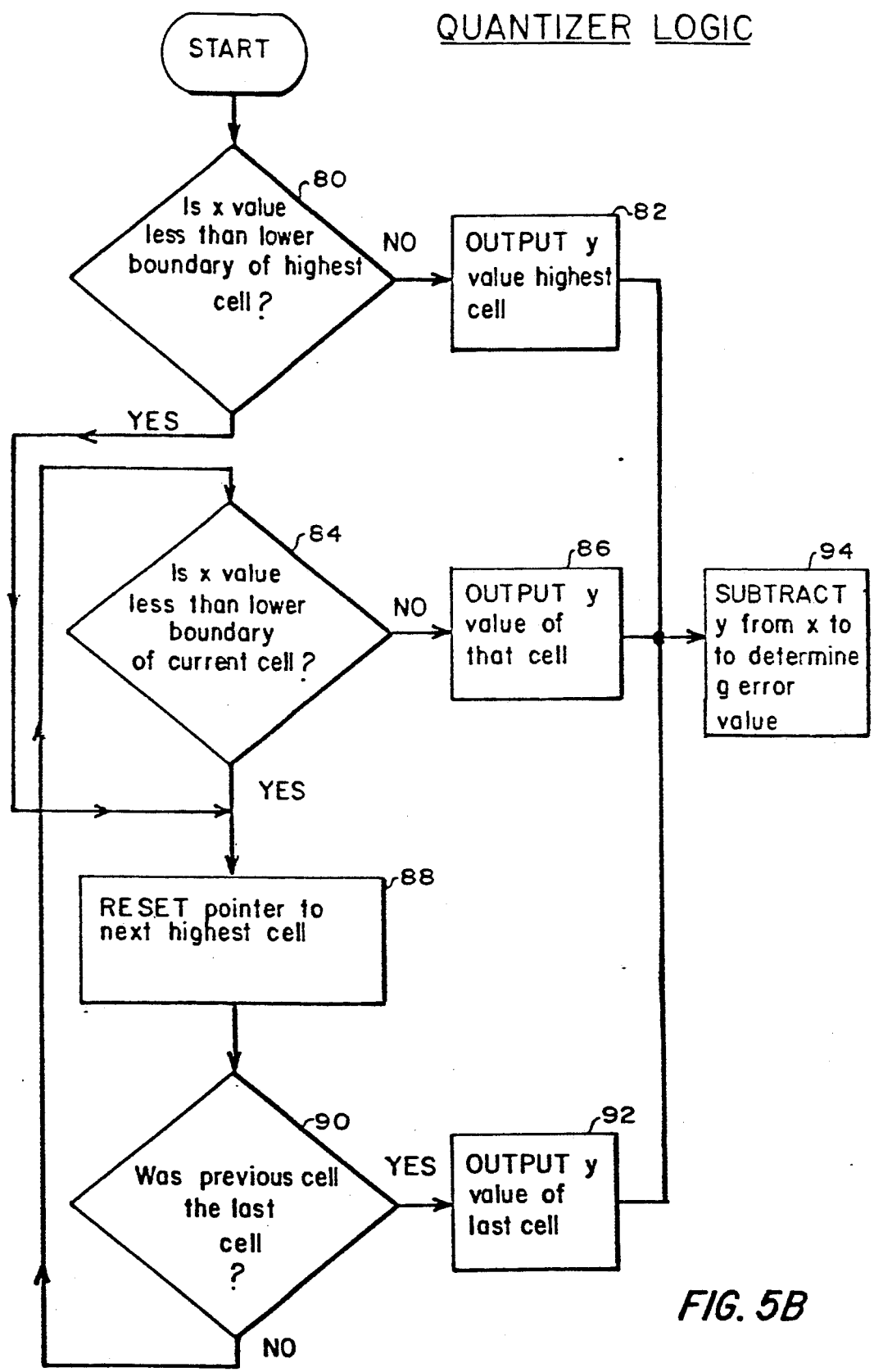
FIG. 5B is a flow chart of logic performed in the quantizers of FIG. 4.

The logic performed by each quantizer is depicted in FIG. 5B. Each quantizer utilizes numerical cells defined by two tables, one containing the lower boundary values $B_k$ of the kth cell and the other containing cell output values $C_k$. A cell pointer is initially set to indicate the highest cell. Each cell has a discrete output value. When an x value is provided from a register of the storage array of the conversion array in which the quantizer is located, the x value is initially compared to the lower boundary value $B_k$ of the highest cell, step 80. If the value is equal to or greater than this lower boundary, the discrete y value of that highest cell is output, step 82. If the x value is less than the lower boundary of the highest cell, the cell pointer is reset to the next highest cell, step 88. The x value is then compared to the lower boundary of the next highest cell, step 84. If the x value is equal to or greater than this new lower boundary, the y value of that cell is output, step 86, and the quantization operation ends. Otherwise, the quantizer proceeds to the next highest cell, step 88 and determines if the previous cell was the last cell, step 90. The quantizer returns to step 84 unless the last cell was reached at which point the quantizer outputs the y value of that last cell, step 92.

After the discrete y value is provided, the y value is subtracted from the x value to determine error value g, step 94. Error value g is then provided to the transformation circuit of that conversion array; quantization continues in successive conversion arrays until the predetermined termination condition is satisfied and the conversion process is halted.

The lower boundary values $B_k$ and the cell output values $C_k$ can represent uniform quantization where the set of discrete y values are equispaced. In some applications, such as in providing converted weights for a digital filter, a logarithmic quantization procedure is desirable. As discussed in detail below, the logarithmic quantization procedure acts upon the magnitude of the x value: the sign, if negative, is removed, stored, and recombined after the procedure is completed. For example, the lower boundary of the $k^{th}$ cell of a system having L cells is $$B_k = 10^{\frac{-P}{40}(2k-1)} \qquad (2)$$

and the cell output value is $$C_k = 10^{\frac{-P}{20}(k-1)} \qquad (3)$$

where P is a quantization parameter selected to provide a desired quantization result, $$k=1, 2, 3 \ldots, L-1 \qquad (4)$$

and $C_L$ is defined to be zero:

$$C_L = 0. \qquad (5)$$

It is desirable to define P in terms of the radix p, that is, the base of the computational system to be utilized, such that $$P = 20 \log_{10}(p). \qquad (6)$$

When equation (6) is substituted for P in equation (3), the cell output becomes $$C_k = [1/p]^{(k-1)}, k=1, 2, 3 \ldots, L-1. \qquad (7)$$

In a number system having p as the radix $$C_k = 1, 0.1, 0.01, 0.001, \ldots \text{ (base p)} \qquad (8)$$

Figure 6:
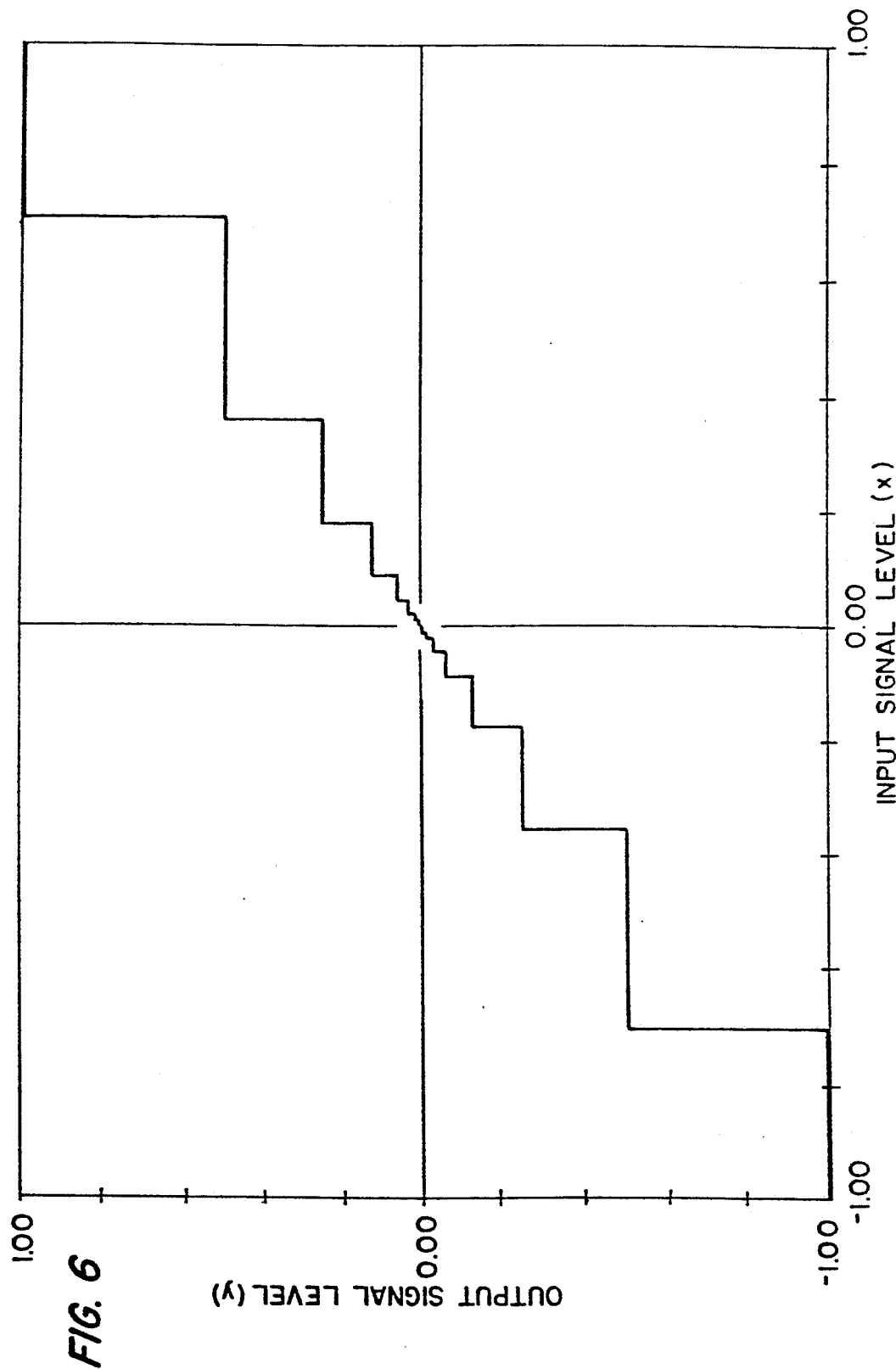
FIG. 6 is a graph of x input and y output for one of the quantizers of FIG. 4.

The x signals and corresponding discrete y output values in the binary computational system for p=2 are presented in FIG. 6 where $$P = 20 \log_{10}(2) = 6.0206 \qquad (9)$$

and, the number of cells, $$L = 16 \qquad (10)$$

and, the lower boundary of the $k^{th}$ cell of a system having L cells, $$B_k = \sqrt{2}/2^k \qquad (11)$$
$$= 0.707, 0.354, 0.177, \ldots, 0.000043$$
$$\text{(base 10)}$$

and the output for each cell, represented in base ten, from Equations (7) and (5) is $$C_k = 1, 0.5, 0.25, 0.125, \ldots, 0.000061, 0. \qquad (12)$$

where $$k = 1, 2, \ldots 15, 16. \qquad (13)$$

The y values, $C_k$, are reciprocals of powers of two and can be represented by a binary fraction having a single nonzero value.

Equations (11) and (12) define the positive x input and resulting y output for positive x values as depicted in the upper right-hand quadrant of FIG. 6. When the sign of the x value is negative, that negative sign is appended to the output to generate the lower left-hand quadrant. In other words, the sign of the x value is removed and stored so that only the magnitude of the x value is considered by the quantizer logic of FIG. 5B; the sign is then added to outputs 82 or 86. Output step 92 then provides zero as the y value of the last cell. If the input signal has a value between 0.707 and 1, as shown in FIG. 6, the output signal is 1; for an input of -0.707 and -1.0, the output voltage is -1. For inputs from 0.354 to 0.706, the output is 0.5; in the binary number system, this output value is represented as 0.1. A continuous range of x values thus produces specific quantized outputs. The input x values are often pre-normalized so that the peak magnitude value is unity.

Figure 7:
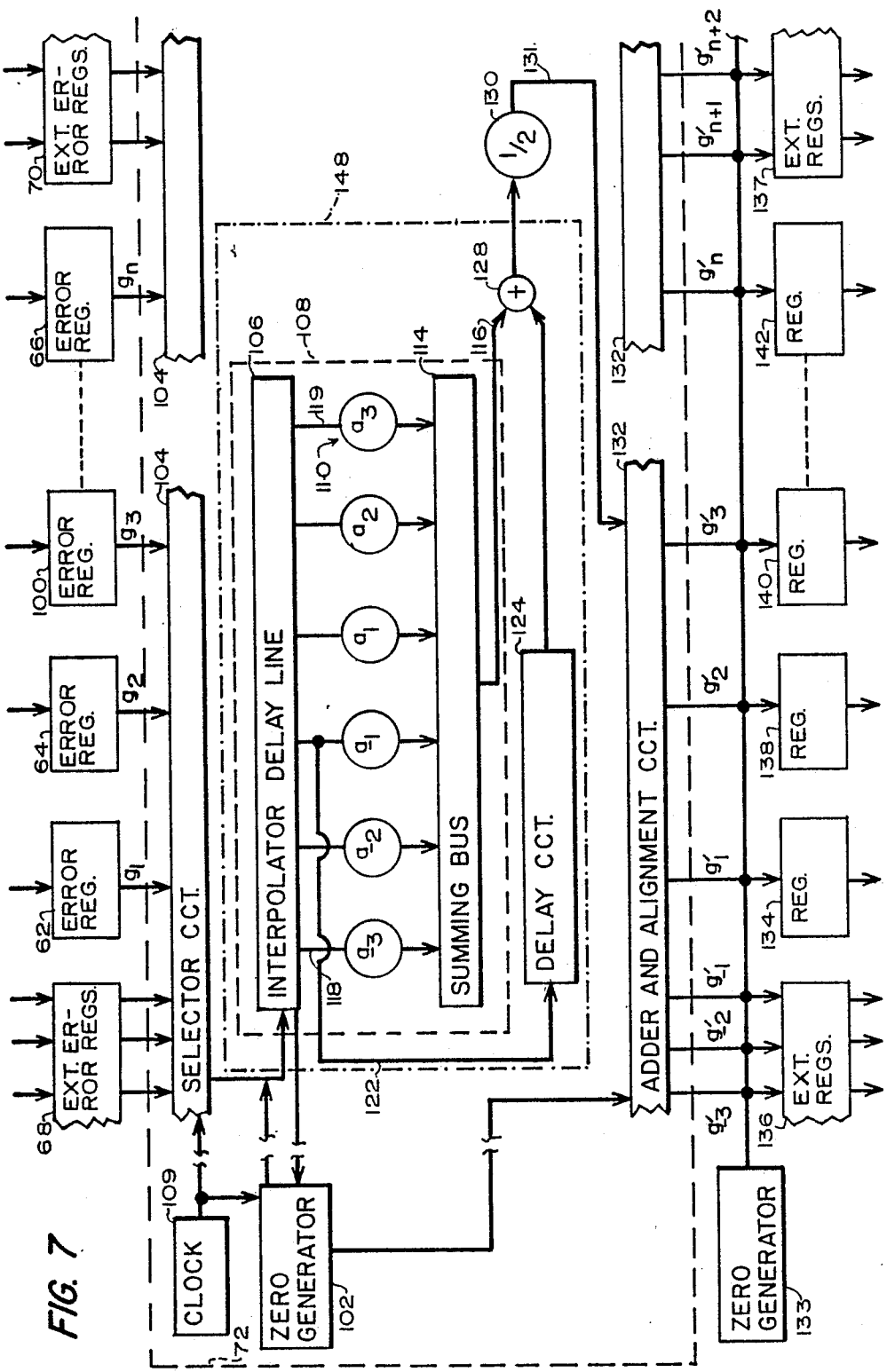
FIG. 7 is a schematic block diagram of the transformation circuit of FIG. 4.

Transformation circuit 72 of FIG. 4 is shown in greater detail in FIG. 7. As described above, upon initial entry, error values $g_1$ and $g_2$ are submitted to transformation circuit 72 by error registers 62 and 64, respectively. Error value $g_1$ derives from $V_1$ and $g_2$ is derived from $V_2$. Error register 100 submits error value $g_3$, derived from original weight value $V_3$, and so on until, at error register 66, $g_n$ is submitted. The second and subsequent times that conversion array 41 is accessed, extension error registers 68 will contain error values $g_{-1}, g_{-2}, g_{-3}$ and so on while extension registers 70 contains $g_{n+1}, g_{n+2}$ and so forth.

All error values are submitted to selector circuit 104 which selects the first error value within extension registers 68 or, during the first pass through conversion array 41, error value $g_1$, from register 62. That is, selector circuit 104 obtains the error value from the first register which is operative at the instant stage of the conversion procedure. Once selector circuit 104 has obtained the first error value from the first operative register, it selects that register and alternate registers to input their values to interpolator delay line 106 of interpolator circuit 108 at a clock rate set by clock 109. Interpolator circuit 108 performs a convolution operation on the data from selector circuit 104. Using the set of interpolator weights $a_{-3}, a_{-2}, a_{-1}, a_1, a_2$ and $a_3$, selected to provide the appropriate weights for multipliers 110, interpolator circuit 108 ideally provides the best possible estimate of the error value intermediate to the two values multiplied by weight $a_{-1}$ and by weight $a_1$. Interpolator weights can be selected by conventional methods such as described in Schafer, R. W., and Rabiner, L. R., "A Digital Signal Processing Approach to Interpolation," Proc. IEEE, vol. 61, pp. 692–702 (1973). After the first set of alternating values is processed by interpolator circuit 108, interpolator delay line 106 is flushed by zero generator 120. The second set of remaining error values is then provided by selector circuit 104 to interpolator circuit 108 where it is processed in an identical manner.

Delay line 106 is flushed after each use by zero generator 120: after the last alternate error value of the first set accessed at tap 118 and before the second set of remaining error values is processed, zero generator 120 fills delay line 106 with zeros. Output to line 116 begins when the first alternate value is accessed by tap 118: that value is multiplied by weight $a_{-3}$ while zero values previously entered by zero generator 120 are accessed at the other taps to multipliers 110. Line 122 samples an input error value which is one-half of a clock period ahead of the interpolator estimate being output on line 116; although this input error value is sampled simultaneously with the output of summing bus 114 on line 116, delay circuit 124 delays this error value by one-half a clock period before it is placed on line 126 by adder 128. Thus the values on line 126 are output at twice the rate of the input to delay line 106. Each value on line 126 is decreased by one-half by multiplier 130. These values are provided to adder and alignment circuit 132 which aligns the values such that input error value $g_1$ is eventually provided as transformed value $g_1'$ to register 134.

A greater number of values are provided from transformation circuit 72 than the number of error values provided to it due to "build-up" and "decay" values obtained during the convolution operation described above. The number of output values on line 116 equals the sum of the interpolator delay line tap count that is, the number of multipliers 110, plus the number of input error values and zero flush values less one. Delay circuit 124 injects additional values, including the input error set, intermediate to the values generated on line 116. Extension registers 136, 137 and registers 134, 138, 140 ... 142 are initially cleared by zero generator 133. The output of multiplier 130 is positioned by adder and alignment circuit 132 so that the $g_1$ component which will appear scaled by one-half is incremented into register 134 associated with transformed error value $g_1'$. Since alternate error values are input by selector circuit 104, the next input value to appear at the output of multiplier 130 from line 122 will be $g_3$ scaled by one-half. This value is incremented into register 140 which is associated with transformed error value $g_3'$. Intermediate to these two values is a value produced by the convolution operation: intermediate registers such as register 138 will receive line 116 values for transformed error value $g_2'$ scaled by one-half. Portions of extension registers 136, 137 are also incremented in this operation.

An equivalent set of operations occurs as the alternate set of inputs from selector circuit 104 is provided to interpolator circuit 108. Input error value $g_2$ scaled by one-half increments register 138 which is associated with transformed error value $g_2'$. The scaled input error values $g_2$, $g_4$ and so on increment registers associated with transformed error values $g_2'$, $g_4'$ and so on. The scaled interpolator values from line 116 now increment the registers associated with transformed error values $g_1'$, $g_3'$ and so forth. As before, some extension registers 136 and 137 will also be incremented by this process.

Some of the growth in size of the transformed error set relative to the size of the original error set is associated with the convolutional nature of the interpolation processor. The merging operation at adder 128 would more than double the size of the transformed error set since two input values to circuit 132 are generated for each input value to delay line 106. Growth in the transformed error set size due to doubling—but not due to convolutional stretching—is avoided by the alternate error value processing scheme described above.

Instead of a formal interpolator as shown in FIG. 7, smoothing device 148, shown in phantom, such as a digital low-pass or bandpass filter might be used instead of interpolator circuit 108, line 122, and adder 128. Multiplier 130 would contain an appropriate scaling value. Alternate values from selector circuit 104 are interspersed with zeros by zero generator 120 and fed to smoothing device 148. The output of smoothing device 148 is appropriately scaled by multiplier 130 and provided to line 131. Of the values that are provided to line 131, alternate filter output values are associated with the nonzero input value set. The intermediate output values are associated with the zero input set and correspond to interpolated values.

The Discrete Fourier Transform of the transformed error set matches the Transform of the original error set to a degree determined by the properties of the transformation circuit. The set of frequencies over which the match occurs extends from zero up to some cutoff frequency value which in the above construction is less than one-half of the fold-over frequency. The fold-over frequency is one-half of the sampling rate of the signal processor according to this invention utilizing the corrected weight sets. The fold-over frequency represents the absolute frequency upper limit for all digital signal processing.

The frequency response of the final quantized weight set can be made to match that of the original weight set very precisely up to the cutoff frequency. The match may or may not be satisfactory beyond this frequency value.

There are at least three procedures for overcoming this limitation. The sampling rate could be increased by a factor of two so that the combination of input filter and sampling rate results in negligible signal content above one-half of the fold-over frequency. The quantized processor behavior would then be under strict control at all frequencies of significant signal energy content.

If the sampling rate is fixed, e.g., because of limitations in A/D conversion, or for some other reason the sampling rate cannot be increased, the sampling rate can be artificially increased by multiplying the sampling rate within the signal processing system according to this invention. A device such as a quantized interpolator can be used to double the sampling rate; a quantized decimator can then be used to return the artificially high rate to the original rate after the signal processor has processed the signals.

Alternatively, the frequency response of the final quantized weight set can be made to match that of the original weight set up to the fold-over frequency by providing each transformed error set to two or more successive conversion arrays. This arrangement is discussed infra in relation to FIG. 9.

An example of an initial weight set and sets of converted weights are shown in Tables I and II, respectively.

TABLE I

INITIAL WEIGHT SET (SYMMETRIC ABOUT INDEX 23)

| Index | Weight Value |
|---|---|
| 0 | −8.693035 E-3 |
| 1 | 0.000000 E 0 |
| 2 | 2.840070 E-3 |
| 3 | 0.000000 E 0 |
| 4 | −1.220171 E-2 |
| 5 | 0.000000 E 0 |
| 6 | 2.328647 E-2 |
| 7 | 0.000000 E 0 |
| 8 | −1.652047 E-2 |
| 9 | 0.000000 E 0 |
| 10 | 3.732680 E-2 |
| 11 | 0.000000 E 0 |
| 12 | −2.145636 E-2 |
| 13 | 0.000000 E 0 |
| 14 | 5.649740 E-2 |
| 15 | 0.000000 E 0 |
| 16 | −1.107322 E-1 |
| 17 | 0.000000 E 0 |
| 18 | 1.133456 E-1 |
| 19 | 0.000000 E 0 |
| 20 | −1.444559 E-1 |
| 21 | 0.000000 E 0 |
| 22 | 8.041280 E-1 |
| 23 | 1.000000 E 0 |

TABLE II

CONVERTED WEIGHT SETS (SYMMETRIC ABOUT INDEX 40)

| Element Index | $Q_1$ | $Q_2$ |
|---|---|---|
| 0 | Zero | 14.00 |
| 1 | Zero | Zero |
| 2 | Zero | −13.00 |
| 3 | Zero | Zero |
| 4 | Zero | 13.00 |
| 5 | Zero | Zero |
| 6 | Zero | −12.00 |
| 7 | Zero | Zero |
| 8 | Zero | 12.00 |
| 9 | Zero | Zero |
| 10 | Zero | −12.00 |
| 11 | −13.00 | −13.00 |
| 12 | 13.00 | 11.00 |
| 13 | 14.00 | 13.00 |
| 14 | −12.00 | −11.00 |
| 15 | −12.00 | −13.00 |
| 16 | 12.00 | 10.00 |
| 17 | −7.00 | −11.00 |
| 18 | −13.00 | −9.00 |
| 19 | 8.00 | −11.00 |
| 20 | 12.00 | 9.00 |
| 21 | −6.00 | 9.00 |
| 22 | −12.00 | −9.00 |
| 23 | 5.00 | −8.00 |
| 24 | 10.00 | −8.00 |
| 25 | −6.00 | 14.00 |
| 26 | −10.00 | 9.00 |
| 27 | 5.00 | 8.00 |
| 28 | 13.00 | 9.00 |
| 29 | −6.00 | −8.00 |
| 30 | 9.00 | −7.00 |
| 31 | 4.00 | −8.00 |
| 32 | −9.00 | 7.00 |
| 33 | −3.00 | 7.00 |
| 34 | 10.00 | Zero |
| 35 | 3.00 | −7.00 |
| 36 | −9.00 | −8.00 |
| 37 | −3.00 | −9.00 |
| 38 | 6.00 | −4.00 |
| 39 | 0.00 | −3.00 |
| 40* | 5.00 | −3.00 |

*Additional zero shift to be added at this index.

The initial weight set shown in Table I is symmetric about index 23 such that the weight value at index 24 is 8.041280 E-1 and the weight value at index 25 is 0.000000; the exponent for each weight value is indicated by the digit following "E". Similarly, the converted weight values in Table II are symmetric about index 40. The word "zero" indicates that a value of zero is produced from the shift device at that index; 0.00 indicates that a zero shift is imposed upon the signal value entering the shift device, i.e., the signal value itself is produced from that shift device. In the converted weights shown in Table II, shifts of one and two place values are not present.

The initial weight set is implemented using a delay line and forty-seven multipliers in an arrangement such as shown in FIG. 1. The converted weight sets $Q_1$ and $Q_2$ can be implemented using eighty-one shift devices for each converted weight set in limited-shift signal processors such as shown in FIG. 2, supra and FIG. 11, infra.

Implementation of the converted weight sets requires an additional zero-shift value at index 40 such as illustrated by shift device 38, FIG. 2: the initial weight value at index 23 is changed to a value of zero before the initial weight set is converted according to the operation shown in FIG. 4, and therefore the original value must be restored. For most conversions it has been empirically determined that changing the central initial weight value to zero improves the accuracy of the conversion.

Figure 8:
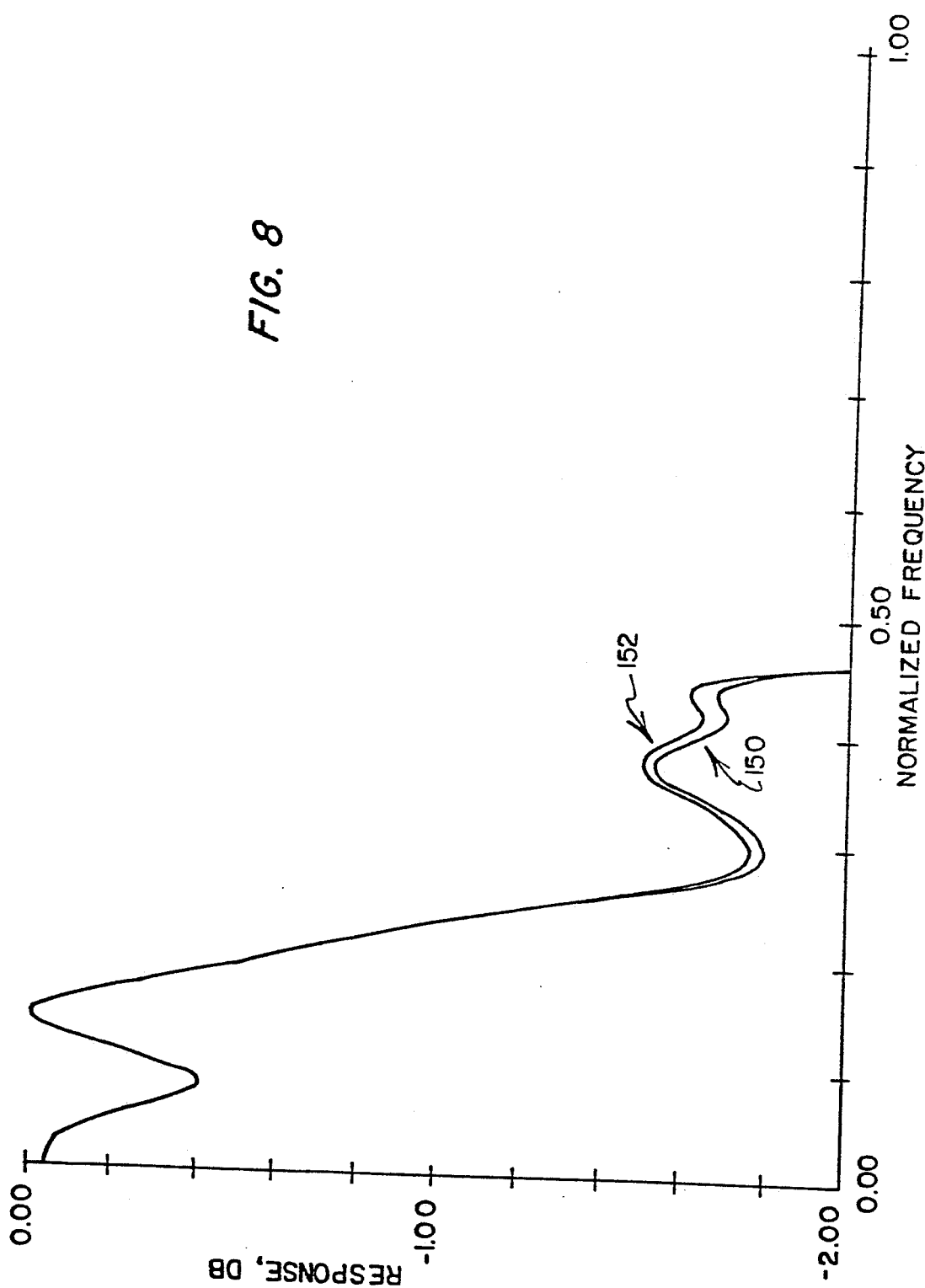
FIG. 8 is a chart of normalized frequency and response in decibels for conventional digital filters implementing the initial set of weights of Table II and digital filters according to this invention implementing the converted set of weights of Table III.

The frequency response of the initial weight set shown in Table I to a signal is shown in FIG. 8 as curve 150. The frequency response of converted weight sets $Q_1$ and $Q_2$, Table II, are indicated by curve 152. Curves 150 and 152 are closely matched in response in decibels up to the normalized frequency of approximately 0.5, where 1.0 represents the fold-over frequency. For example, where the maximum frequency of the data is 3000 Hz, a typical sampling rate is twice the maximum data frequency or 6000 Hz. The foldover frequency is one-half the sampling rate or 3000 Hz; 3000 Hz is normalized to the value of 1.0.

Figure 9:
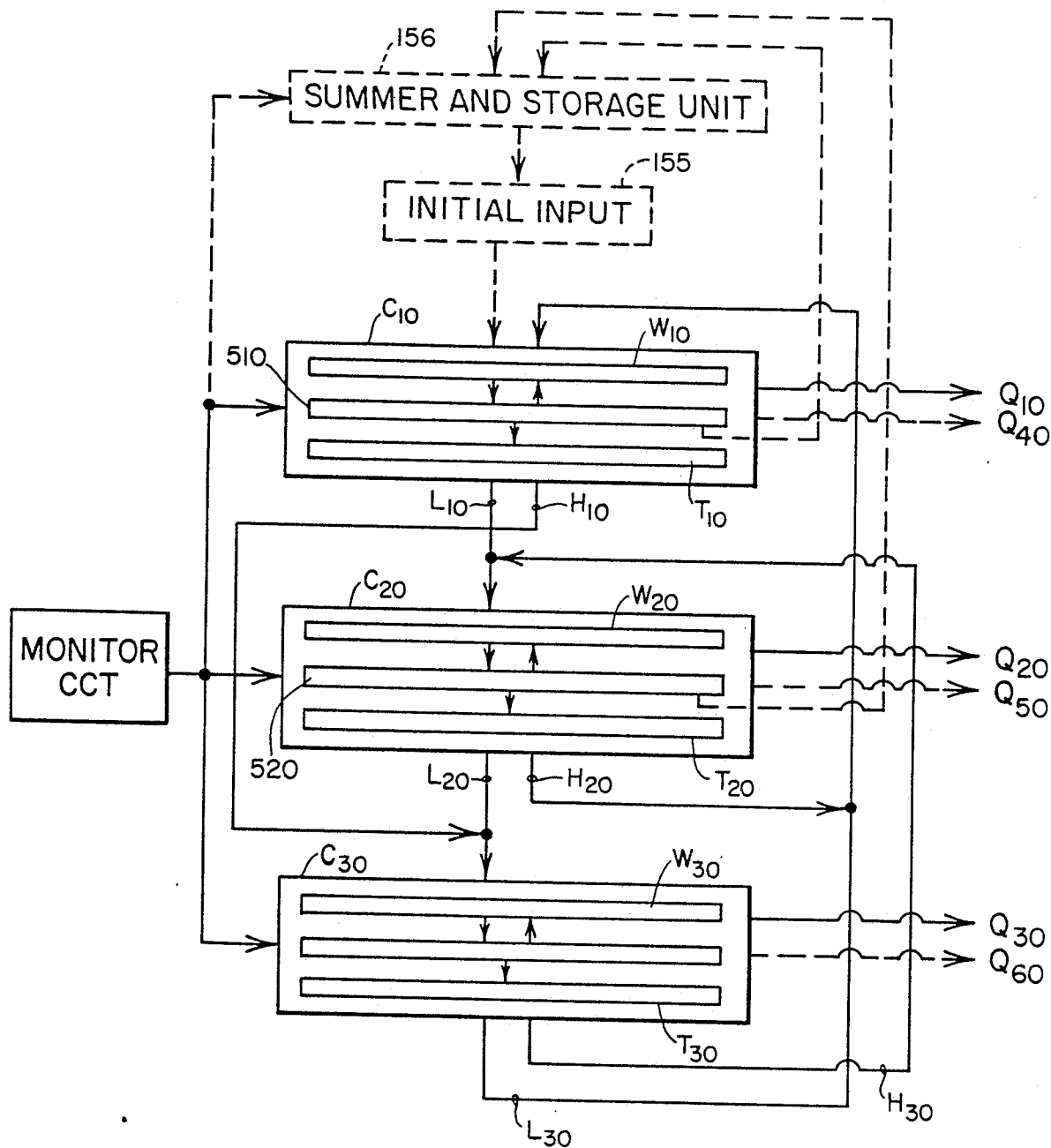
FIG. 9 is a schematic block diagram of another apparatus for converting a set of initial weights.

When it is desired that the improved signal processor according to this invention implementing the converted sets of weights match the response of a conventional signal processor using the initial set of weights, the sampling rate can be doubled. For example, signal values can be provided at a rate of 12,000 Hz instead of 6,000 Hz. The lower half of the fold-over frequency becomes 0–3000 Hz, which matches the frequency span of the signal values. An alternative arrangement is shown in FIG. 9 and discussed infra.

The converted weight sets of Table II are developed by converting the initial weight set of Table I using two conversion arrays such as conversion arrays 41, 41a of conversion apparatus 39a, FIG. 4. Interpolation circuits including multipliers similar to multipliers 110, FIG. 7, implement the interpolation weight set shown in Table III.

TABLE III

INTERPOLATOR WEIGHT SET (SYMMETRIC ABOUT INDEX 37)

| Index | Weight Value |
|---|---|
| 0 | 8.539050E-4 |
| 1 | 0.000000E 0 |
| 2 | −1.094330E-3 |
| 3 | 0.000000E 0 |
| 4 | 1.760830E-3 |
| 5 | 0.000000E 0 |
| 6 | −2.672815E-3 |

TABLE III-continued
INTERPOLATOR WEIGHT SET (SYMMETRIC ABOUT INDEX 37)

| Index | Weight Value |
|---|---|
| 7 | 0.000000E 0 |
| 8 | 3.874815E-3 |
| 9 | 0.000000E 0 |
| 10 | −5.445740E-3 |
| 11 | 0.000000E 0 |
| 12 | 7.437160E-3 |
| 13 | 0.000000E 0 |
| 14 | −9.950740E-3 |
| 15 | 0.000000E 0 |
| 16 | 1.309665E-2 |
| 17 | 0.000000E 0 |
| 18 | −1.701551E-2 |
| 19 | 0.000000E 0 |
| 20 | 2.190686E-2 |
| 21 | 0.000000E 0 |
| 22 | −2.807552E-2 |
| 23 | 0.000000E 0 |
| 24 | 3.600032E-2 |
| 25 | 0.000000E 0 |
| 26 | −4.650686E-2 |
| 27 | 0.000000E 0 |
| 28 | 6.115556E-2 |
| 29 | 0.000000E 0 |
| 30 | −8.331476E-2 |
| 31 | 0.000000E 0 |
| 32 | 1.217730E-1 |
| 33 | 0.000000E 0 |
| 34 | −2.0883525E-1 |
| 35 | 0.000000E 0 |
| 36 | 6.354887E-1 |
| 37 | 0.000000E 0 |

The initial weight set was iteratively processed through the two conversion arrays for twelve conversion operations. The first eleven operations involved quantization and error transformation in a current conversion array and incrementation of the storage registers of the next conversion array. On the twelfth and last operation, only a quantization was performed; the error values were simply discarded. Table IV shows the peak error values and the number of transformed error values generated by each operation. The magnitude of the peak error value tends toward smaller values but is not monotonic during successive operations. The transformed error set grows by 74 terms after each cycle but many of these values placed in the extension registers are very small. After the eleventh operation there were 861 accessed error registers. Of those 861 error values, only 81 were quantized to a nonzero value in the twelfth and last operation. Similarly, of the 787 error values generated during the tenth operation, only 59 quantized values remained after quantization in the eleventh operation. $Q_1$ and $Q_2$ therefore contained 59 and 81 terms, respectively, as shown in Table II; twenty-two zero values were added to $Q_1$ to provide that weight set with the same number of terms as $Q_2$.

TABLE IV
CONVERSION OPERATION DATA

| Operation No. | Peak Error dB re Unity | No. Transformed Error Values Produced |
|---|---|---|
| 1 | −14.16 | 121 |
| 2 | −31.35 | 195 |
| 3 | −35.07 | 269 |
| 4 | −38.88 | 343 |
| 5 | −40.68 | 417 |
| 6 | −46.21 | 491 |
| 7 | −47.08 | 565 |
| 8 | −46.93 | 639 |
| 9 | −46.82 | 713 |
| 10 | −46.77 | 737 |
| 11 | −46.00 | 861 [59]* |
| 12 (last) | −45.98 | — [81]* |

*No. quantized values.

Alternative conversion apparatus 39b, FIG. 9, produces quantized weight sets $Q_{10}$, $Q_{20}$, and $Q_{30}$ which match over the entire foldover frequency an original weight set provided to it. The transformed error set from the conversion array currently in operation is provided to two successive arrays instead of to a single successive conversion array as described in FIGS. 4 and 7, supra. As shown in FIG. 7, the interpolated output on line 116 was added to the delayed value from delay circuit 124. This results in a transformed error set formed by low-pass filter action, as indicated by smoothing device 148. In conversion arrays $C_{10}$, $C_{20}$ and $C_{30}$, FIG. 9, a high-pass transformed set is also created by transformation circuits $T_{10}$, $T_{20}$, and $T_{30}$, respectively, and provided to a separate one of the conversion arrays. For example, conversion array $C_{10}$ receives initial input 155 into storage array $W_{10}$, quantizes the input to produce a discrete set and an error set, transforms the error set in transformation circuit $T_{10}$, and then produces low-pass set $L_{10}$ and high-pass set $H_{10}$. Low-pass set $L_{10}$ is provided as described supra to a successive conversion array, here conversion array $C_{20}$. High-pass set $H_{10}$, however, is provided to a different conversion array, here conversion array $C_{30}$. At least two conversion arrays are required for this procedure: when only conversion arrays $C_{10}$ and $C_{20}$ are present, conversion array $C_{10}$ provides low-pass set $L_{10}$ to array $C_{20}$ and provides high-pass set $H_{10}$ to itself, i.e., to storage array $W_{10}$.

In one procedure, converted weight sets $Q_{10}$, $Q_{20}$, and $Q_{30}$ are produced as described in relation to FIGS. 3 and 4 supra and the final error values discarded. Alternatively, the final error values, hereinafter referred to as residual error values, are saved, without undergoing transformation, and utilized as successive initial input to derive quantized weight set $Q_{40}$, $Q_{50}$, and $Q_{60}$, indicated in phantom. Additional accuracy in signal processing is achieved when all six quantized weight sets are utilized.

Weight sets $Q_{40}$, $Q_{50}$, $Q_{60}$ are obtained as follows. If conversion arrays $C_{10}$, $C_{20}$, and $C_{30}$ are operated in sequence and conversion array $C_{30}$ is the last conversion array that has been operated, for example, storage array $W_{30}$ contains only a discrete set while conversion array $C_{10}$ contains in storage array $W_{10}$ the sum of three sets: a previously formed discrete set that is combined with a high-pass set provided by conversion array $C_{20}$ and the low-pass set just provided by conversion array $C_{30}$. Storage array $W_{20}$ contains a discrete set added to the high-pass set just provided by conversion array $C_{30}$. Quantization circuits 510, 520 of conversion arrays $C_{10}$, $C_{20}$ are operated to quantize storage arrays $W_{10}$, $W_{20}$, respectively. The residual error set formed by quantization circuits 510, 520 is provided to summer and storage circuit 156, shown in phantom, which adds the residual error sets while retaining their distributed positions and subsequently provides the residual error sum as a subsequent set of initial input 155.

Figure 10:
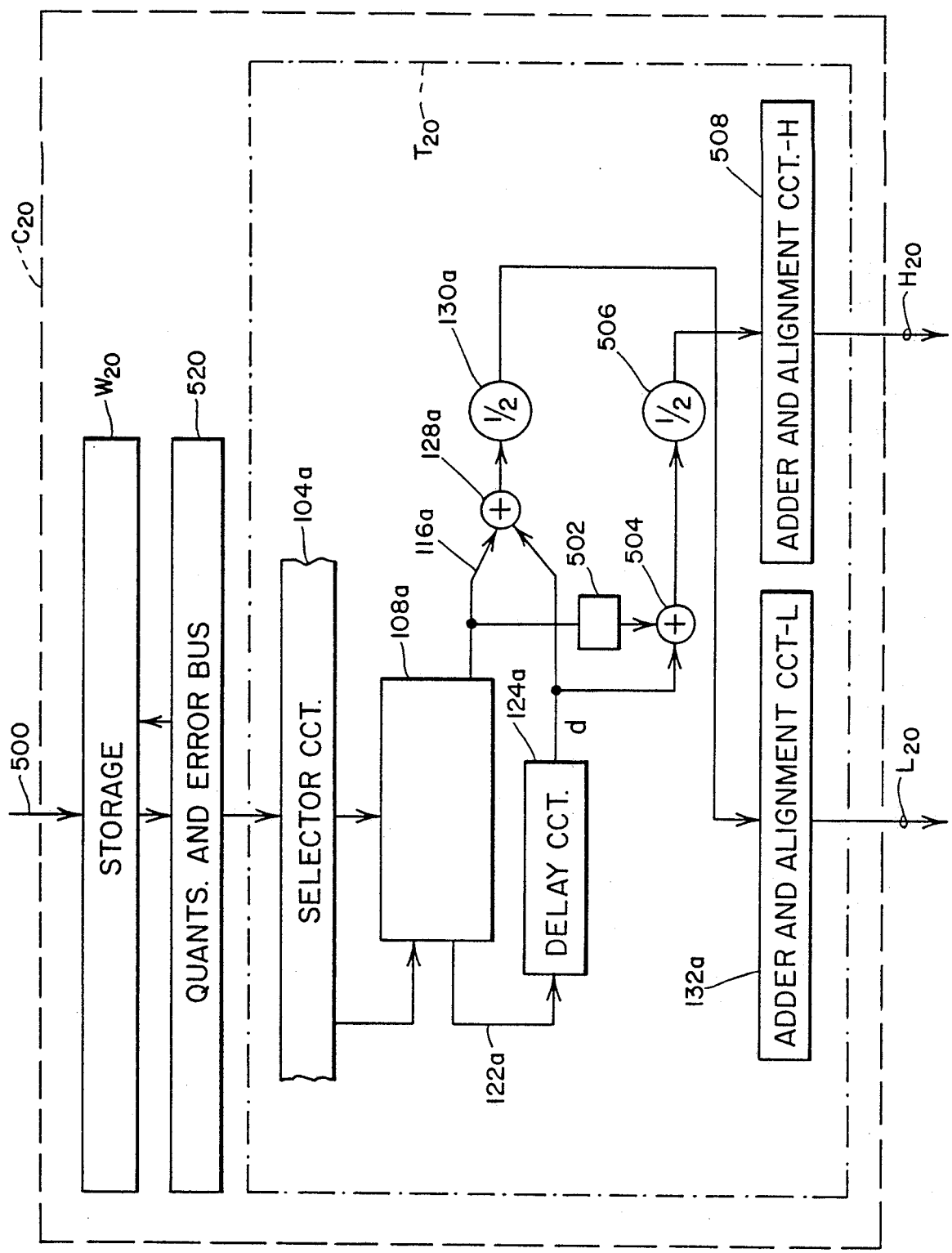
FIG. 10 is a more detailed block diagram of the transformation circuit of FIG. 9.

Transformation circuit $T_{20}$ of array $C_{20}$ is shown in greater detail in FIG. 10. Line 500 receives one of low-pass set $L_{10}$ or high-pass set $H_{30}$ and combines it with the contents of storage array $W_{20}$. When conversion arrays $C_{10}$, $C_{20}$, $C_{30}$ are operated in sequence and low-pass set $L_{10}$ is combined in storage array $W_{20}$, the sum is quantized in circuit 520 to produce a discrete set and an error set, the discrete set is returned to replace the contents of storage array $W_{10}$, and the error set is provided to selector circuit 104a. Interpolator circuit 108a provides interpolated values i on line 116a which are added to delayed values d from delay circuit 124a in adder 128a. The sum is halved by multiplier 130a and provided to adder and alignment circuit 132a. The above operation is equivalent to the operation of transformation circuit 72, FIG. 7. Low-pass set $L_{20}$, FIG. 10, is provided by adder and alignment circuit 132a.

High-pass set $H_{20}$ is also provided by transformation circuit 72a. Interpolated values i are negated by negation circuit 502 and negatively added to delayed values d at adder 504. The difference is halved by multiplier 506 and provided to adder and alignment circuit 508.

The quantized weights, once obtained, can be implemented using a signal processor according to this invention which includes a shift device for each weight, such as for processor 30, FIG. 2. Alternatively, all signal values to be shifted by a specified place value amount, as indicated by the arrangement and shift values of the quantized weights to be implemented, can be routed to a single shift concentrator summer which additively combines those signal values to provide a single sum to be shifted by that specified amount. Preferably, there are as many shift concentrator summers as the number of different shift values specified by the quantized weight set. The sums from the shift concentrator summers are then appropriately added together, taking place-value-shift amount into account, to produce a single weighted sum output; this final addition accomplishes the specified shifting.

Improved signal processor 160, FIG. 11, includes delay line 162, steering circuit 164, shift concentrators 166, and a final summer such as adder register 168. Signal values are successively input, least significant bit (LSB) first, to delay line 162 as indicated by arrow 12b and successively advanced, as timed by clock 163, past a predetermined number of taps such as taps 170a, 170b, . . . 170k. The number of output taps is determined by the number of quantized weights; eighty-one taps are required to implement the converted weight sets shown in Table 2.

Shift concentrators 166 and final adder register 168 cooperate to shift and combine signal values as conveyed by steering circuit 164. Shift concentrators 166 combine signal values to be shifted by the same specified place value amount and provide that sum, one for each value of shift, to final adder register 168.

Figure 15:
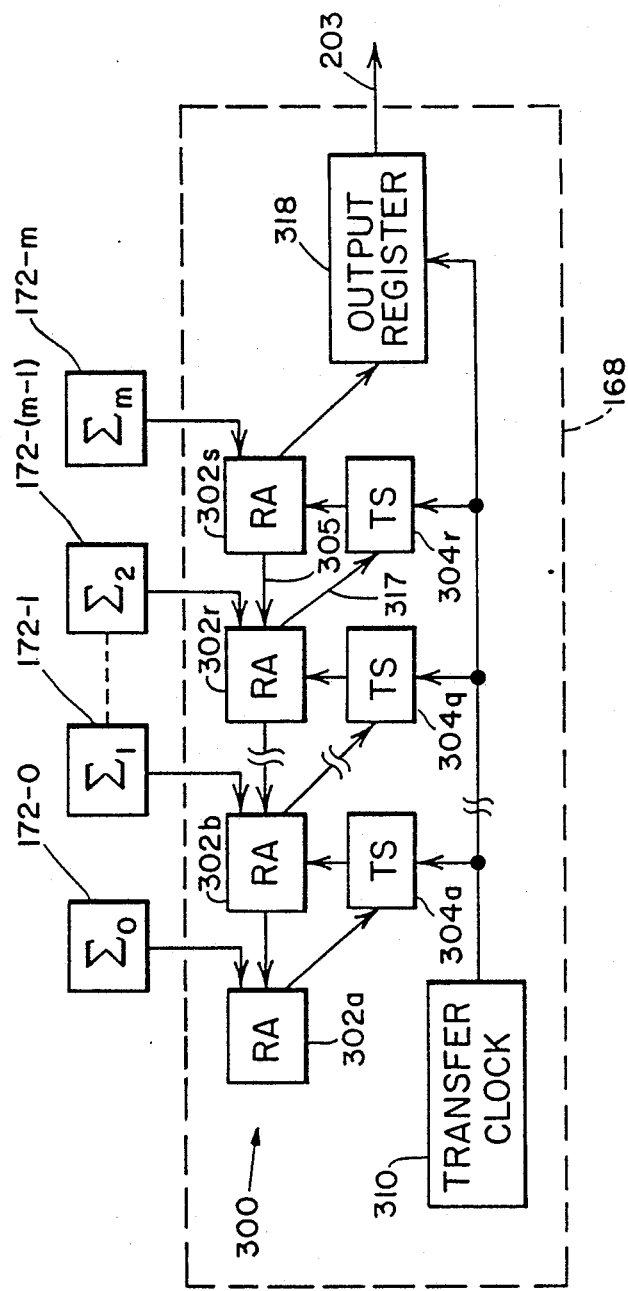
FIG. 15 is a more detailed schematic of the final summer of FIG. 11.

As described infra in relation to FIG. 15, final adder register 168 combines the sums while retaining their respective shift-determined place values. Shift concentrators 166 include shift concentrator summers 172-0, 172-1, . . . 172-m, each providing a single sum to shift devices 174 including shift circuits 176-0, 176-1, . . . 176-m, respectively. Shift concentrators 166 and shift devices 174 function as generating circuit 178, indicated in phantom. When the quantized weights include zero values, generating circuit 178 further includes zero circuit 180, described infra.

Each signal value, hereinafter referred to as a signal element, is schematically represented in FIG. 11 by four bits. Signal element 184 is defined by magnitude bits 186, 188, and 190 and by sign bit 192, each shown in a memory cell of delay line 182. The preferred format involves twos complement representation of numerical values. Bit 186 is the most significant bit and bit 190 is the least significant bit. Signal element 184 is shifted out of delay line 162 in bit serial fashion through output tap 170c as a delay output. Similarly, bits 194, 196, 198 and sign bit 200 of signal element 202 are output in that order through output tap 170d.

The time period required by signal processor 160 to operate on all bits of a signal element is hereinafter referred to as a word frame. This time period includes repeated processing of the sign bits, once fetched, in sign-extension fashion, as needed, in order to flush out the various storage elements associated with the shift concentrator summers and final adder register. At the end of each word frame an ultimate weighted sum output becomes available as indicated by arrow 22b.

Shift concentrators 166 include as many shift concentrator summers as the number of shifts to be accomplished; each shift concentrator summer, e.g., a multiple-input, bit-serial adder, corresponds to a shift value of the quantized weights to be implemented. Shift concentrator summer 172-0 provides for the shift of the sum of one or more signal elements provided to it by "0.00" as shown in Table II, that is, the signal element sum is passed with its original place value. Bus 206-0 provides in parallel one or more signal elements to summer 172-0. Shift concentrator summer 172-1 provides for the shift of the sum of signal elements received through bus 206-1 by one place to the right. There are a sufficient number of shift concentrator summers such that the greatest shift value m is accommodated; shift concentrator summer 172-m provides for the shift of the sum of the signal elements provided through bus 206-m by m places to the right.

Depending on the shift values of the quantized weights, obtained as described supra in relation to FIGS. 3–10, certain shift values may not be required and therefore shift concentrator summers and their respective shift devices implementing these shift values are not required. The required element polarities are achieved by appropriate negation operations in steering circuit 164; the shift concentrator sums require no polarity changes in this construction.

To implement the values shown in Table 2, fifteen shift concentrator summers with their respective shift circuits are indicated; however, there are no 1 or 2 place-value shifts so that 13 concentrator summers will suffice. The weights indicating that a value of "zero" is to be applied at a tap can be implemented within steering circuit 164 by an open line or can be implemented by directing all delay outputs designated to be set to zero to zero circuit 180. Zero circuit 180 is an open circuit or is a circuit set to ground.

Steering circuit 164, a configuration matrix, conveys signal elements in bit serial order to the input ports of shift concentrators 166 as determined by the element index, polarity and shift value of the quantized weights to be implemented by signal processor 160. For example, if the quantized weights indicate that signal elements at taps 170a, 170c, and 170k are to be shifted one place to the right, shift concentrator summer 172-1 is provided with those signal elements as input. This may be accomplished by a branch simply consisting of fixed electrical paths connecting the output taps to the shift concentrator summer input ports or may be more complex as shown infra in FIG. 12. In addition, the signal element at each output tap is conveyed to as many shift concentrators 166 as there are unique shift values in the quantized weights associated with that tap position. If both a "zero" value and a shift value are indicated by the sequence of two sets of preselected quantized weights, the signal element at that tap is conveyed to one shift concentrator summer and to zero circuit 180, or just to one shift concentrator.

Figure 12:
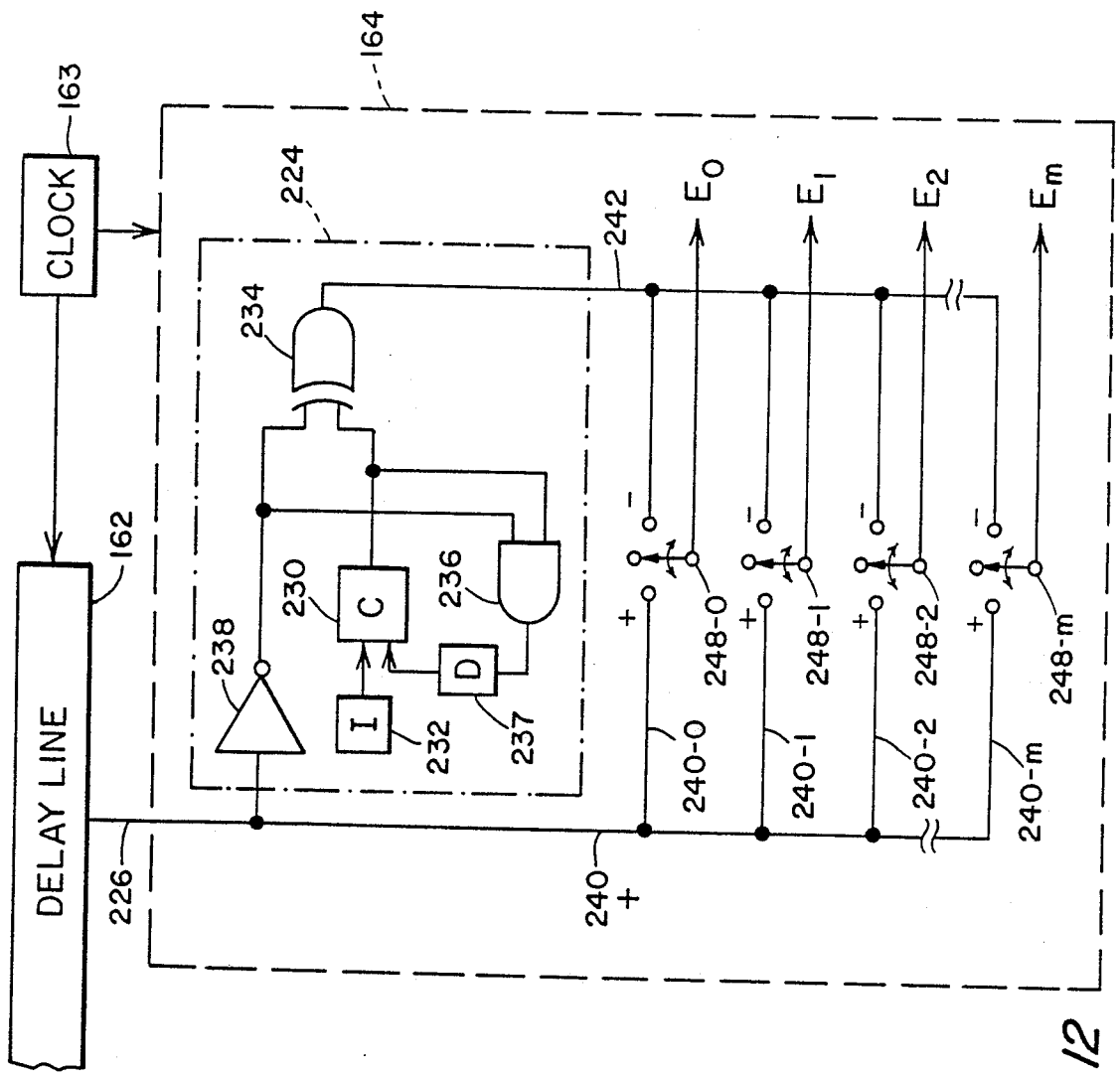
FIG. 12 is a schematic of a negation circuit and adaptation switches within the steering matrix of FIG. 11.

Steering circuit 164, FIG. 12, allows the processor of FIG. 1 to be configured according to the converted weight set specifications as may be found in Table II, for example. In that Table element index 30, for example, is shown requiring a shift of 9 places without negation and a shift of 7 places with negation. In general every signal element 170 from the delay line 162, FIG. 11, must be made available in direct and negated form for distribution as required to the shift concentrator summers 166 by steering circuit 164.

In FIG. 12, a portion of steering circuit 164 is shown and a typical element tap signal entry is shown on line 226 which corresponds to one of the lines 170 of FIG. 11. Line 226 is brought down to line 240 from whence positive signal element distributions may be made to the appropriate shift concentrator summers as indicated by lines 240-0, 240-1 . . . 240-m. Negated signal elements are accessed on line 242. Switches 248-0, 248-1 . . . 248-m are single pole, triple-throw switches. In the center position, no connection is made, and in the right and left position a negative or positive signal element, respectively, is accessed. Setting all switches 248-0 . . . 248-m to the center position is equivalent to setting line 226 to zero, or steering it to zero value circuit 180 FIG. 11. Also shown in FIG. 12 is a twos complement, serial negation circuit 224. At the start of each word frame the one bit carry storage element 230 is initialized from storage element 232 to binary one. The element serial bit stream on line 226 is inverted (ones complemented) by inverter circuit 238. The output of inverter 238 and carry storage 230 are combined in "exclusive or" circuit 234 to produce the negated element signal at point 242 for distribution, as required, to the appropriate shift concentrator summers. The two inputs of "exclusive or" circuit 23 are processed by "and" circuit 236 to produce the appropriate carry bit for the next bit interval of the word frame. This new carry data is delayed appropriately by delay element 237 before input to carry storage 230 to prevent conflict with current bit interval operation. The process shown in FIG. 12 for generation and distribution of direct element signal 240 and negated element signal 242 are replicated within steering circuit 164, as required, to meet the needs of the converted weight sets as described, for example, in Table II.

A single negation for a tap may be achieved in some cases instead negating some but not all of the delay outputs from that tap. Indeed, a single quantized weight can be derived for that tap even when a number of quantized weight sets are utilized. The quantized weights to be implemented can be recast into one or more terms having the same sign, consolidated into a single term, or combined to produce a zero value. Using the quantized weights in Table II as an example, the shift values 9 and −7 of weight sets $Q_1$ and $Q_2$, respectively, at element index 30 can be represented and combined as $$\frac{1}{2^9} - \frac{1}{2^7} = \frac{-3}{2^9} = \frac{-2-1}{2^9} = -\frac{1}{2^8} - \frac{1}{2^9} \quad (14)$$

Equation (14) shows that 9 and −7 are equivalent to −8 and −9, both having a negative value.

The quantized weights can be consolidated as shown for shift values −10 and 9 at element index 26 to produce a single shift value 10:

$$-\frac{1}{2^{10}} + \frac{1}{2^9} = \frac{-1+2}{2^{10}} = \frac{1}{2^{10}} \quad (15)$$

Consolidation is also possible for shift values of equal magnitude; shift values −13 and −13 at element index 11, for example, can be combined as a single shift value of −12:

$$-\frac{1}{2^{13}} - \frac{1}{2^{13}} = \frac{-2}{2^{13}} = \frac{-1}{2^{12}} \quad (16)$$

Additionally, shift values having opposite polarities and the same magnitude cancel each other to produce a value of zero. The number of nonzero digits in the numerical representation of the one or more quantized weights to be applied to a particular tap can thus be controlled both during the conversion operation as described supra regarding FIGS. 3–10 and after the conversion operation by numerical manipulations.

Figure 13:
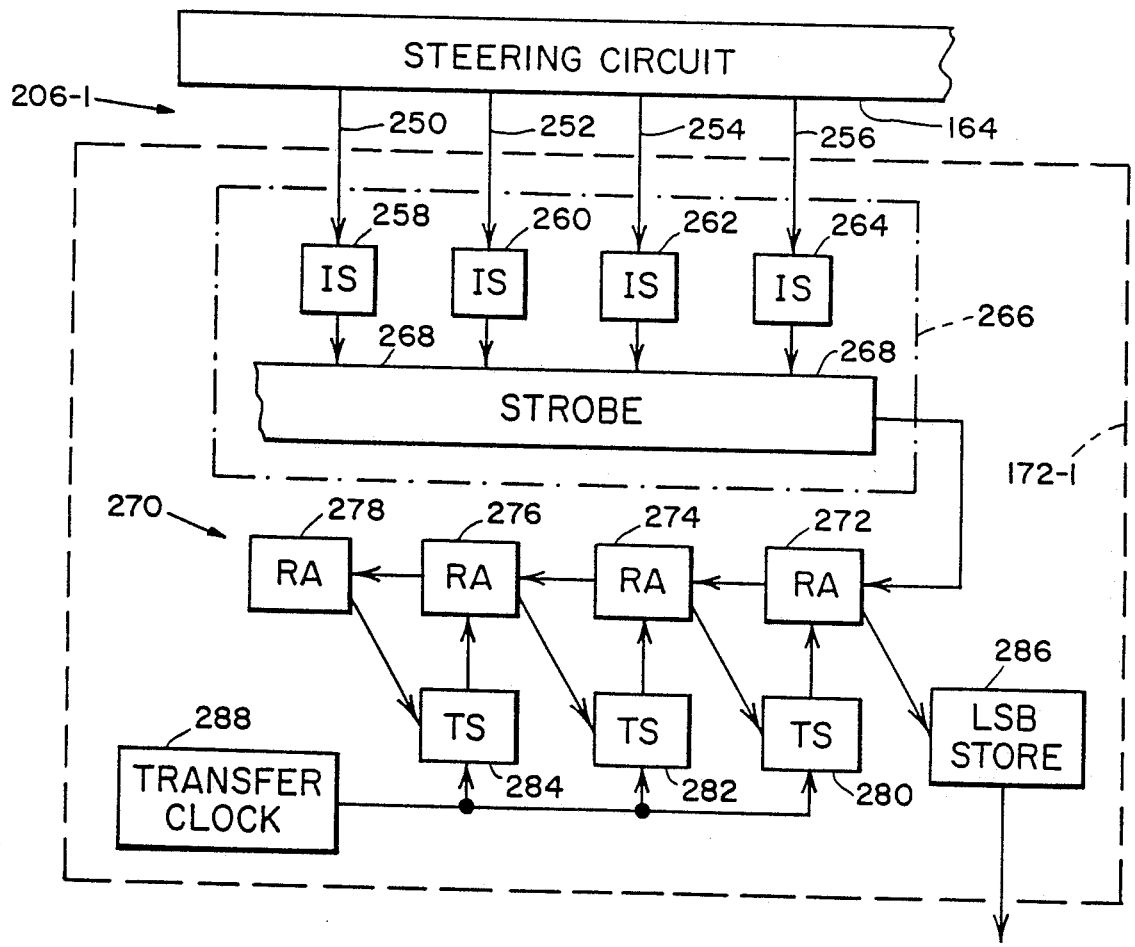
FIG. 13 is a more detailed view of one of the shift concentrator summers of FIG. 11.

Shift concentrator summer 172-1 is shown in greater detail in FIG. 13. Steering circuit 164 provides signal elements from a number of taps (possibly negated) through bus 206-1 containing in parallel lines 250, 252, 254 and 256. Each of the four signal elements is provided in bit serial fashion to input storage units 258, 260, 262 and 264, respectively, of parallel-to-serial convertor 266. Strobe 268 sequentially provides the bits serially to counter chain 270 including register adders 272, 274, 276 and 278. The actual number of register adders is selected according to the predetermined maximum possible sum value for one or more desired configurations in order to preclude overflow in the shift concentrator summer.

Each successive set of bits entered during each bit sub-interval of the word frame into input storage devices 258, 260, 262 and 264 have the same place value; the least significant bits are entered during the first bit subinterval, such as bits 190, 194 of signal elements 184, 202, respectively, as shown in FIG. 11. Afte each set of bits of equivalent place value is successively entered through counter chain 270, FIG. 13, counter chain 270 prepares to receive the next set of bits of higher place value in the next bit subinterval by shifting the contents of register adders 274, 276 and 278 into transfer storage units 280, 282 and 284, respectively, and then into register adders 272, 274, and 276, respectively. Prior to the transfer from 280 to 272, the contents of register adder 272 are directly provided to least significant bit storage 286. The least significant bit from each bit subinterval of the word frame represents a valid output bit of the ultimate sum of shift concentrator summer 210 for that word frame with the LSB of the sum occurring first. The next set of bits are provided in parallel to input storage 258, 260, 262 and 264 which are then serially provided through strobe 268 to register adders 272, 274, and 276, respectively, where they are combined with the contents of transfer storage units 280, 282 and 284, respectively, at a rate determined by transfer clock 288. Register adder 278 and transfer storage device 284 may be replicated to the left as required to avoid overflow so that a true count is always maintained.

In effect, the operation of shift concentrator summer 172-1 is equivalent to a multiple input bit-serial adder. At the start of each word frame counter chain 270 and LSB store 286 are initialized to zero. Logical one values are counted in each bit subinterval in an operation known as a population counter operation. At the end of each bit subinterval a valid bit output of the sum of the four signal elements is provided through LSB store 286. The actual shifting of place value is accomplished by the manner in which the sum of each shift concentrator device is provided to final adder register 168, described infra in relation to FIG. 15.

Figure 14:
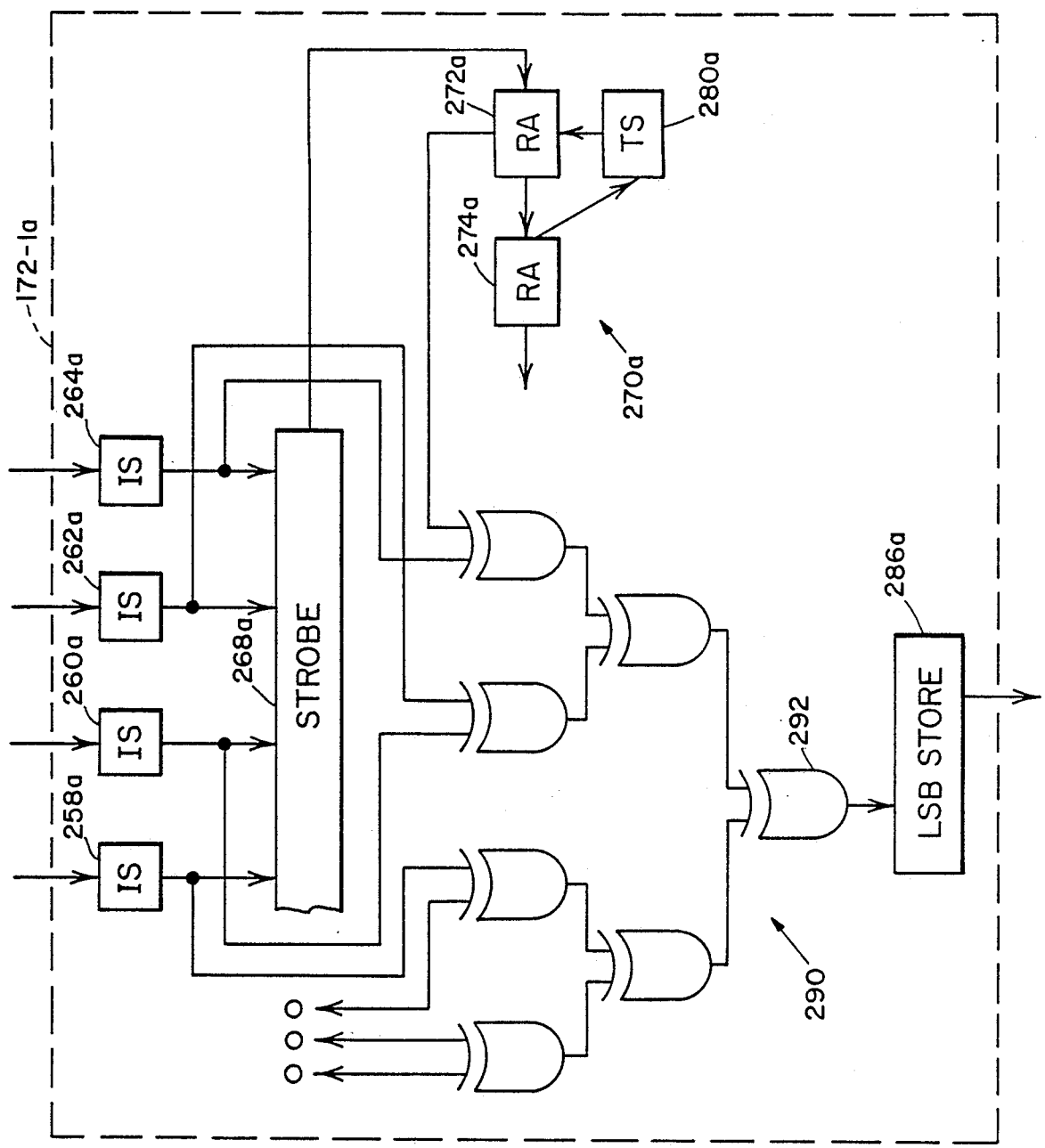
FIG. 14 is a schematic of an alternative arrangement of a shift concentrator summer including look-ahead capability.

Alternative shift concentrator device 172-1a is shown in FIG. 14 with a look-ahead least significant bit generator 290. The counting of the logical ones during each bit subinterval, that is, each population counter operation, need not be completed in order to resolve the least significant bit at such subinterval. The least significant bit which will result in a given bit subinterval can be determined by counting the logical ones provided in parallel from input storage units 258a, 260a, 262a, and 264a in conjunction with the digit provided to register adder 272a by transfer storage 280a at the end of the previous bit subinterval. If the number of logical ones in this set is odd, exclusive OR 292 provides a one to least significant bit storage 286; if the number of logical ones is even, a zero is provided to storge 286a. The look-ahead procedure permits the new least significant bit to be provided to the final adder register in advance during a bit subinterval while population counts are being taken to increment counter chain 270a in the shift concentrator unit.

Final adder register 168 is shown in greater detail in FIG. 15. The bit serial sum outputs of shift concentrator summers 172-0, 172-1, 172-2 . . . .172-m are additively injected successively into counter chain 300 according to their respective place values. The output of shift concentrator summer 172-m has the lowest place value, i.e., is to be right-shifted to the greatest extent, and is provided as additive input to register adder 302s. At the start of each word frame, counter chain registers 300 and output register 318 are initialized to zero. During each bit subinterval of the word frame, the least significant bit of each shift concentrator summer is successively injected additively into counter chain 300, starting with the LSB from summer 172-m. After the resulting ripple carry has cleared register adder 302r, the LSB from 172-(m-1) is additively injected into register adder 302r. Finally the LSB from 172-0 is injected additively into register adder 302a to complete the bit subinterval. There will exist register adder and transfer storage units to the left of register adder 302a and transfer storage 304a, as required, to accommodate carries in this ripple adder so that overflow is precluded. The LSB additive injections from the shift concentrator summers are thus delayed in time so that ripple carries, if any, may propagate properly down the line without interference from an LSB addition at another point in the line.

After shift concentrator summer 172-0 has entered its least significant bit, transfer clock 310 commands register adders 302a, 302b, to shift into transfer storage units 304a, 304b (not shown), respectively, and so on until transfer storage 304r has received a bit on line 317. The contents of register adder 302s, however, are provided directly to output register 318. The first bit provided to output register 318 from adder 302s represents the least significant bit of the ultimate weighted sum output 22b of signal processor 160. By shifting the contents of counter chain 300 into transfer storage 304a, 304b, . . . 304r, the values in counter chain 300 are shifted one place to the right to align the counter chain contents with the appropriate place value position of the next bit (next bit subinterval of the word frame) of the bit serial sum outputs from the shift concentrator summers. The ripple adder described may be too slow for some applications; higher speed can be achieved by arranging in series four-bit adders with look-ahead carry-outputs such as described in Z. H. Meiksin and P. C. Thakray, *Electronic Design with Off-the-Shelf Integrated Circuits*, Prentice-Hall (2nd Ed. 1984).

The operation of the shift concentrator summers and of the final adder register 168 continues within each word frame until the sign bits of the element signals in delay line 162 are entered and processed. These sign bits are repeatedly fetched and processed according to known sign-extension techniques in order that the stored information in the shift concentrator summer registers 270, FIG. 13, and in the final adder registers 300, FIG. 15, may be moved out to contribute properly to the final output word of each word frame. The bits of the final output of signal processor 160 are provided from output register 318; it is acceptable to accumulate in register 318 all the bits of the ultimate weighted sum and then truncate them as desired.

The operation of sampling signal elements at the output taps, conveying each sampled signal element (a) to an open line or a zero circuit to set it to zero, (b) to an open line and one or more shift devices, (c) to at least two different shift devices, or (d) at least twice to the same shift device, shifting and combining as indicated by the quantized weights, is repeated until a preselecte condition is accomplished. The preselected condition may be a predetermined number of word frames, operation until no further signal values are received, or another desired condition.

A limited-shift signal processor according to this invention is described above as a single complete system. Alternatively, such as in digital filter applications, the limited-shift-signal processor may be constructed from several filters arranged in series or in parallel which have their outputs combined to form the ultimate weighted sum output.

For example, after a first conversion operation which produces a first group of converted weight sets and a first residual error set, a second group of converted weight sets may be derived from the first residual error set by using that error set as initial input to a conversion apparatus as described above. The first and second groups of converted weight sets can be directly, additively combined as described in relation to equations (14)–(16) to produce a single combined weight set group which provides improved signal processing performance over the first group of converted weight sets.

Figure 16:
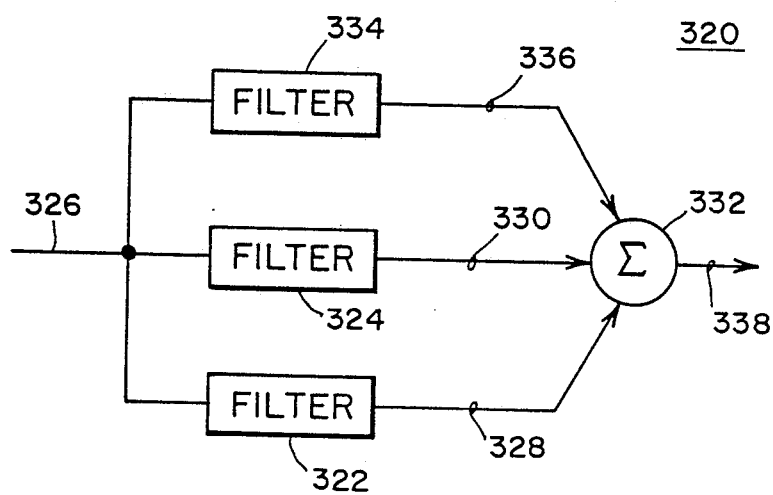
FIG. 16 is a schematic block diagram of a limited-shift signal processor according to this invention constructed from a number of signal processing units.

Alternatively, the improved signal processing performance can be achieved by implementing each of the first and second weight set groups separately in individual signal processing units such as first and second digital filters 322, 324, respectively, of signal processor 320, FIG. 16. These two filters can be arranged in parallel having a common input 326. The two output signals 328, 330 are then summed in final summer 332 to provide the improved signal processing performance which is equivalent to numerically combining the first and second weight set groups and implementing the combined weight set group in a single filter.

Further, the residual error set produced during derivation of the second group of weight sets can be converted to provide a third group of converted weight sets. This third group is implemented by a third filter 334 operated in parallel with the first and second filters. Its output 336 is appropriately combined with weighted sum signals 328, 330 in final summer 332 to provide final weighted sum signal 338.

Thus, increased filtering performance can be achieved as desired by adding additional filters in parallel. Each filter has a controlled level of complexity; filter complexity is tailored through control of the converted weight sets.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A high-speed, limited-shift signal processor for quantized weighting of an input signal, comprising:
   delay means for receiving the input signal and providing a plurality of delay outputs;
   steering means;
   a plurality of summing means;
   providing means;
   means for generating at least one modified value from each delay output, including a plurality of means for shifting the digit positions of preselected delay outputs to modify each preselected delay output by limited predetermined shifting of its place value, each of said means for shifting accomplishing one of a plurality of different place value shifts;
   said plurality of summing means, interposed between said delay means and said means for generating, for combining delay outputs preselected to undergo the same place value shift, each summing means producing a combined delay output value;
   said providing means, interposed between said summing means and said means for shifting, for providing each combined delay output value to at least one of said means for shifting;
   said steering means, interposed between said delay means and said plurality of summing means, for steering said preselected delay outputs to one or more of said summing means to effect a preselected distribution of said preselected delay outputs; and
   final summing means for summing each of said place-value-shifted delay outputs generated by said means for shifting to obtain a weighted sum signal of the input signal.

2. The limited-shift signal processor of claim 1 in which each said means for shifting accomplishes a single predetermined place value shift selected from zero to a limited maximum number of place value shifts.

3. The limited-shift signal processor of claim 1 in which there is only one means for shifting to accomplish each of said different predetermined place value shifts.

4. The limited-shift signal processor of claim 1 in which each of said means for shifting is operatively connected to one of said summing means.

5. The limited-shift signal processor of claim 1 further including means for selectively negating said preselected delay outputs.

6. The signal processor of claim 1 in which said means for steering includes means for selectively negating the preselected delay outputs.

7. The signal processor of claim 1 in which said means for generating generates at least two modified values from each delay output.

8. The limited-shift signal processor of claim 1 in which said means for steering includes means for selectively negating said preselected delay outputs.

9. The limited-shift signal processor of claim 1 in which said means for steering includes means for reconfiguring the steering of delay outputs.

10. The limited-shift signal processor of claim 9 in which said means for reconfiguring includes switching means for modifying the distribution of said preselected delay outputs to said means for shifting.

11. The limited-shift signal processor of claim 1 in which said means for generating further includes means for setting predesignated delay outputs to zero.

12. The limited-shift signal processor of claim 11 in which said means for steering directs each delay output to at least one of (a) one or more of said means for shifting and (b) said means for setting.

13. The limited-shift signal processor of claim 11 in which said means for steering directs each delay output to one of (a) said means for setting to zero, (b) said means for setting to zero and at least one of said means for shifting, (c) at least two different means for shifting, and (d) at least twice to the same means for shifting.

14. A high-speed, limited-shift signal processor for quantized weighting of an input signal, comprising:
   delay means for receiving the input signal and providing a plurality of delay outputs;
   steering means;
   a plurality of summing means;
   providing means;
   means for generating at least one modified value from each delay output, including a plurality of means for shifting the digit positions of preselected delay outputs, each said means for shifting accomplishing a predetermined place value shift selected from zero to a limited maximum number of place value shifts;
   said plurality of summing means, interposed between said delay means and said means for generating, for combining delay outputs preselected to undergo a same shift in place value, each summing means producing a combined delay output value;
   said providing means, interposed between said summing means and said means for shifting, for providing each combined delay output value to at least one of said means for shifting;
   said steering means, interposed between said delay means and said plurality of summing means, for steering said preselected delay outputs to one or more of said summing means to effect a preselected distribution of said preselected delay outputs; and
   final summing means for summing each of said place-value-shifted delay outputs generated by said means for shifting to obtain a weighted sum signal of the input signal.

15. A high-speed, limited-shift signal processor for quantized weighting of an input signal, comprising:
   delay means for receiving the input signal and providing a plurality of delay outputs;

means for generating at least one modified value from each delay output, including a plurality of means for shifting the digit positions of preselected delay outputs, each said means for shifting accomplishing a predetermined place value shift selected from zero to a limited maximum number of place value shifts;

said means for generating further including means for setting pedesignated delay outputs to zero;

means for steering each said preselected delay output to one or more of said means for shifting and for steering each said predesignated delay output to said means for setting; and xeans for summing each of said place-value-shifted delay outputs generated by said means for shifting to obtain a weighted sum signal of the input signal.

16. A high-speed, limited-shift signal processor for quantized weighting of an input signal, comprising:

delay means for receiving the input signal and providing a plurality of delay outputs;

steering means;

means for generating at least two modified values from substantially each delay output, at least one modified value being generated from each said delay output, including a plurality of means for shifting preselected delay outputs, corresponding to quantized weights having shift values, by digit positions commanded by the shift values to modify each preselected delay output by limited shifting of its place value, each shift value represented by a term having a limited number of nonzero digits;

said means for generating further including means for setting to zero predesignated delay outputs corresponding to quantized weights representing a value of zero;

said steering means, interposed between said delay means and said means for generating, for steering each said preselected delay output to one or more of said means for shifting and for steering each said predesignated delay output to said means for setting;

means, connected to one or more of said means for shifting, for selectively negating said preselected delay outputs according to the polarity of said quantized weights; and final summing means for summing each of said place-value-shifted delay outputs generated by said means for shifting to obtain a weighted sum signal of the input signal.

17. The limited-shift signal processor of claim 16 in which the term for each shift value has a single nonzero digit.

18. The limited-shift signal processor of claim 16 in which the quantized weights having a shift value and the quantized weights representing a value of zero are distributed together in at least two sets and the sets are adjusted to have the same number of quantized weights.

19. The limited-shift signal processor of claim 18 in which said delay means provides the same number of delay outputs as the number of quantized weights in each adjusted quantized weight set.

20. A high-speed, limited-shift signal processor for quantized weighting of an input signal, comprising:

a plurality of signal processing units for operating on the input signal, each unit including:

delay means for receiving the input signal and providing a plurality of delay outputs;

steering means;

means for generating at least one weighted modified value from each delay output, including a plurality of means for shifting the digit positions of preselected delay outputs to modify each preselected delay output by limited predetermined shifting of its place value;

said steering means for steering said preselected delay outputs to one or more of said means for shifting;

means for summing each of said place-value-shifted delay outputs generated by said means for shifting to obtain a weighted sum signal of the input signal; and final summer means for combining the weighted sum signals of said signal processing units to provide a final weighted sum signal of the input signal.

21. The limited-shift signal processor of claim 20 in which said signal processing units are connected to operate in parallel on the input signal.

22. A method of weighting an input signal, comprising:

receiving the input signal and delaying it to provide a plurality of delay outputs;

selecting at least some of the delay outputs to be modified by limited shifting of their place values;

generating at least one modified value from each delay output including shifting the place value of each selected delay output by one of a number of predetermined digit positions;

adding together, before shifting, the selected delay outputs to be shifted by a same shift amount; and summing each of the place-value-shifted delay outputs to obtain a weighted sum signal of the input signal.

23. The method of claim 22 further including negating selected ones of the delay outputs.

24. The method of claim 22 further including setting to zero the unselected delay outputs.

25. A method of weighting an input signal by a first group of quantized weights derived from a plurality of original, non-quantized weights representing a preselected weighting specification, comprising:

converting the plurality of original weights into the first group of quantized weights such that each quantized weight is represented by a term having a limited number of nonzero digits;

receiving the input signal and delaying it to provide a plurality of delay outputs;

matching, to one of the delay outputs, each quantized weight representing a nonzero weighting value;

shifting the place value of each matched delay output to modify it by the limited number of nonzero digits of that quantized weight; and summing each of the place-value-shifted delay outputs to obtain a first weighted sum signal of the input signal.

26. The method of claim 25 in which each quantized weight representing a nonzero weighting value is represented by a term having a single nonzero digit.

27. The method of claim 25 further including setting any unmatched delay outputs to zero.

28. The method of claim 25 further including negating selected ones of the matched delay outputs according to the polarity of the quantized weights.

29. The method of claim 25 further including:

retaining residual error values generated during the conversion of the plurality of original weights into the first group of quantized weights;

converting the residual error values into a second group of quantized weights such that each quantized weight is represented by a term having a limited number of nonzero digits; and providing a final weighted sum signal which is a function of the first and second group of quantized weights and the input signal.

30. The method of claim 29 in which the providing includes:

receiving the input signal and delaying it to provide a plurality of second delay outputs;

matching, to one of the second delay outputs, each quantized weight of the second group representing a nonzero weighting value;

shifting the place value of each matched second delay output to modify it by the limited number of nonzero digits of that quantized weight of the second group;

summing each of the place-value-shifted delay outputs to obtain a second weighted sum signal of the input signal; and combining the first and second weighted sum signals to provide the final weighted sum signal of the input signal.

* * * * *